US012426338B2

(12) United States Patent
Xie et al.

(10) Patent No.: US 12,426,338 B2
(45) Date of Patent: Sep. 23, 2025

(54) BURIED POWER RAIL WITH ROBUST CONNECTION TO A WRAP AROUND CONTACT

(71) Applicant: International Business Machines Corporation, Armonk, NY (US)

(72) Inventors: Ruilong Xie, Niskayuna, NY (US); Kangguo Cheng, Schenectady, NY (US); Julien Frougier, Albany, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 748 days.

(21) Appl. No.: 17/511,725

(22) Filed: Oct. 27, 2021

(65) Prior Publication Data

US 2023/0130088 A1 Apr. 27, 2023

(51) Int. Cl.
 *H01L 29/417* (2006.01)
 *H01L 23/528* (2006.01)
 (Continued)

(52) U.S. Cl.
 CPC ....... *H10D 64/258* (2025.01); *H01L 23/5283* (2013.01); *H01L 23/5286* (2013.01);
 (Continued)

(58) Field of Classification Search
 CPC ........... H01L 29/41775; H01L 23/5283; H01L 23/5286; H01L 27/092; H01L 29/0665;
 (Continued)

(56) References Cited

U.S. PATENT DOCUMENTS 7,002,187 B1  2/2006  Husher
9,570,395 B1  2/2017  Sengupta et al.
(Continued)

FOREIGN PATENT DOCUMENTS

CN  113178444 A  7/2021
EP  3 454 366 A1  3/2019
(Continued)

OTHER PUBLICATIONS

Ryckaert, J., et al., "Scaling CMOS beyond FinFETs: from nanosheets and forksheets to CFETs", published Dec. 4, 2019, 28 pages, https://www.imec-int.com/en/imec-magazine/imec-magazine-december-2019/scaling-cmos-beyond-finfets-from-nanosheets-and-forksheets-to-cfets.

(Continued)

*Primary Examiner* — Tong-Ho Kim
(74) *Attorney, Agent, or Firm* — Scully, Scott, Murphy & Presser, P.C.; Samuel Waldbaum

(57) ABSTRACT

A buried power rail contact structure is provided that wraps around a source/drain region of a first field effect transistor (FET), contacts a surface of a buried power rail, and has a reduced height as compared to a height of a neighboring source/drain contact structure that contacts a surface of a source/drain region of a second FET. Both the buried power rail contact structure and the source/drain contact structure have a negative taper, i.e., each of the buried power rail contact structure and the source/drain contact structure has outermost sidewalls that slope outward from a topmost surface of the contact structure to a bottommost surface of the contact structure. Such contact structures reduce the parasitic capacitance between a functional gate structure and the contact structure.

16 Claims, 19 Drawing Sheets

(51) Int. Cl.
- *H01L 27/092* (2006.01)
- *H01L 29/06* (2006.01)
- *H01L 29/423* (2006.01)
- *H01L 29/786* (2006.01)
- *H10D 30/67* (2025.01)
- *H10D 62/10* (2025.01)
- *H10D 64/23* (2025.01)
- *H10D 84/85* (2025.01)

(52) U.S. Cl.
CPC ..... *H10D 30/6713* (2025.01); *H10D 30/6729* (2025.01); *H10D 30/6735* (2025.01); *H10D 62/118* (2025.01); *H10D 84/85* (2025.01)

(58) Field of Classification Search
CPC ......... H01L 29/41733; H01L 29/42392; H01L 29/78618; H01L 29/165; H01L 29/0673; H01L 29/775; H01L 21/76883; H01L 21/76895; H01L 21/76897; H01L 23/535; H01L 29/41725; H01L 29/66439; H01L 29/66545; H01L 29/78696; B82Y 10/00
USPC ....................................................... 257/288
See application file for complete search history.

(56) References Cited

U.S. PATENT DOCUMENTS

| | | |
|---|---|---|
| 9,865,544 B2 | 1/2018 | Jung |
| 10,636,739 B2 | 4/2020 | Beyne et al. |
| 10,840,146 B1 | 11/2020 | Paul et al. |
| 10,878,162 B2 | 12/2020 | Peng et al. |
| 11,004,789 B2 | 5/2021 | Doornbos et al. |
| 2018/0026042 A1 | 1/2018 | Smith et al. |
| 2019/0386011 A1 | 12/2019 | Weckx et al. |
| 2020/0006155 A1* | 1/2020 | Chiang ........... H01L 21/823864 |
| 2020/0134128 A1 | 4/2020 | Peng et al. |
| 2020/0135578 A1 | 4/2020 | Ching et al. |
| 2020/0135634 A1 | 4/2020 | Chiang et al. |
| 2020/0219813 A1 | 7/2020 | Paul et al. |
| 2020/0411436 A1* | 12/2020 | Xie .................... H01L 21/76877 |
| 2021/0028112 A1* | 1/2021 | Kim .................. H01L 29/41791 |
| 2021/0098338 A1 | 4/2021 | Liaw |
| 2021/0183711 A1* | 6/2021 | Dentoni Litta ... H01L 21/76895 |
| 2021/0193821 A1* | 6/2021 | Dentoni Litta ....... H01L 27/092 |
| 2021/0351303 A1 | 11/2021 | Ju et al. |
| 2022/0157957 A1* | 5/2022 | Jin .................. H01L 21/823871 |

FOREIGN PATENT DOCUMENTS

| | | |
|---|---|---|
| EP | 3836196 A1 | 6/2021 |
| EP | 4423810 A1 | 9/2024 |
| JP | 2023-065325 A | 5/2023 |
| WO | 2021/075540 A1 | 4/2021 |
| WO | 2023/073486 A1 | 5/2023 |

OTHER PUBLICATIONS

Gupta, A., et al., "Buried Power Rail Integration with Si FinFETs for CMOS Scaling Beyond the 5 nm Node", 2020 Symposium on VLSI Technology Digest of Technical Papers, Dec. 2020, 2 pages, vol. 67, Issue: 12.

International Search Report dated Jan. 12, 2023, received in a corresponding foreign application, 10 pages.

* cited by examiner

BURIED POWER RAIL WITH ROBUST CONNECTION TO A WRAP AROUND CONTACT

BACKGROUND

The present application relates to semiconductor technology, and more particularly to a semiconductor structure containing a buried power rail contact structure that wraps around a source/drain region of a first field effect transistor, contacts a surface of a buried power rail, and has a reduced height as compared to a height of a neighboring source/drain contact structure.

When forming a structure including a plurality of complementary metal oxide semiconductor (CMOS) devices, such as integrated circuits, standard cells may be used as a base unit for designing and manufacturing the integrated circuits. The standard cell(s) may be used to form one or more functional circuits, and each standard cell may have the same footprint (e.g., may have a standard footprint). Using standard cells when designing complex circuits and components reduces design and manufacture costs.

In use, each standard cell of a semiconductor device requires power input (Vdd) and ground (Vss) connections. To power the various components thereof, each standard cell is generally coupled to a power rail which is electrically connected to an active layer of the standard cell to provide the power (Vdd). In some instances, a plurality of power rails may be provided for each standard cell to respectively provide the power (Vdd) and the ground (Vss).

Conventional power rails are formed in the back-end-of-line (BEOL) levels. To improve the scaling and reduce the routing complexity of the signal lines, one method is to move the power rails away from BEOL and form them beneath the active devices. One typical structure is a buried power rail, which is typically embedded in a shallow trench isolation structure of a semiconductor device. Buried power rails are connected to a source/drain region of a field effect transistor (FET) utilizing a via-to-buried power rail (VBPR) contact structure. Conventional VBPR contact structures are in close proximity to a source/drain contact structure which contacts a source/drain region of a neighboring FET. This close proximity between the VBPR contact structure and the source/drain contact structure provides increased parasitic capacitance between the functional gate structure and the contact structures. There is thus a need to provide a buried power rail contact structure that mitigates parasitic capacitance between the functional gate structure and the contact structures (i.e., buried power rail contact structure and source/drain contact structure).

SUMMARY

A buried power rail contact structure is provided that wraps around a source/drain region of a first field effect transistor (FET), contacts a surface of a buried power rail, and has a reduced height as compared to a height of a neighboring source/drain contact structure that contacts a surface of a source/drain region of a second FET. Both the buried power rail contact structure and the source/drain contact structure have a negative taper, i.e., each of the buried power rail contact structure and the source/drain contact structure has outermost sidewalls that slope outward from a topmost surface of the contact structure to a bottommost surface of the contact structure. Such contact structures reduce the parasitic capacitance between a functional gate structure (i.e., a component of a FET) and the contact structure.

In one aspect of the present application, a semiconductor structure is provided. In one embodiment, the semiconductor structure includes a first functional gate structure having a first source/drain region and located in a first active area of a semiconductor substrate, and a second functional gate structure having a second source/drain region and located in a second active area of the semiconductor substrate. A shallow trench isolation structure separates the first active area of the semiconductor substrate from the second active area of the semiconductor substrate. A buried power rail is located between the first active region and the second active region and beneath a topmost surface of the shallow trench isolation structure. A buried power rail contact structure having a negative taper is present that contacts the buried power rail and the first source/drain region. A source/drain contact structure having a negative tapper is also present that contacts the second source/drain region, wherein the buried power rail contact structure has a topmost surface that is vertically offset from, and located beneath, a topmost surface of the source/drain contact structure.

In another aspect of the present application, a method of forming a semiconductor structure is provided. In one embodiment, the method includes forming at least a contact conductor material layer contacting physically exposed surfaces of each source/drain region of a first functional gate structure and a second functional gate structure, and a physically exposed surface of the buried power rail that is located in a region between the first and second functional gate structures. The contact conductor material layer is then patterned utilizing a subtractive metal etch to provide a precursor buried power rail contact structure and a source/drain contact structure. The precursor buried power rail contact structure is subsequently etched to provide a buried power rail contact structure that has a reduced height as compared to a height of the source/drain contact structure.

DETAILED DESCRIPTION

Figure 1:
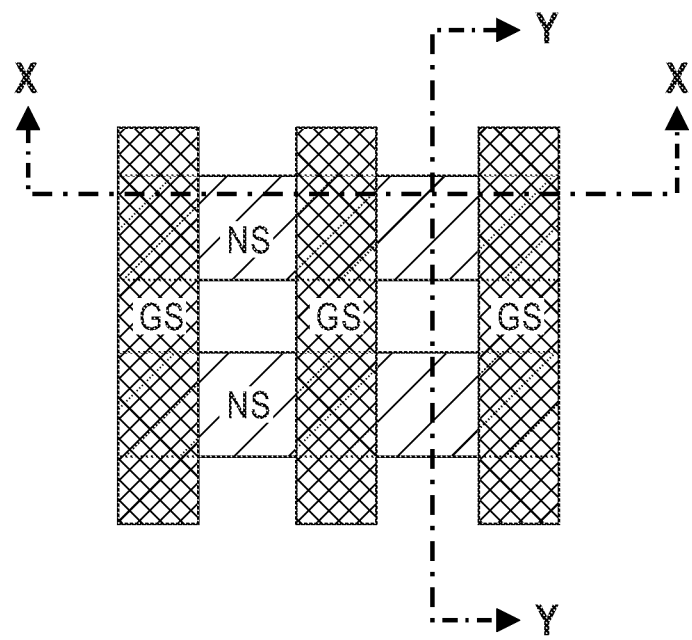
FIG. 1 is a diagram showing a layout including a plurality of gate structures that extend over a portion of a pair of nanosheet stacks including cuts X-X and Y-Y that will be used in the present application to describe various cross sectional views of the exemplary semiconductor structure of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is provided a diagram showing a layout including a plurality of gate structures GS that extend over a portion of a pair of semiconductor nanosheets NS; the semiconductor nanosheets NS are employed as semiconductor channel material structures. FIG. 1 includes cuts X-X and Y-Y that will be used in the present application to describe various cross sectional views of the exemplary semiconductor structure of the present application. Cut X-X is through one of the nanosheet stacks, while cut Y-Y is located in a region that is located between two adjacent gate structures GS.

Although semiconductor nanosheets NS are described and illustrated in the present application, the present application works equal well when other types of semiconductor channel material structures are employed. Exemplary semiconductor channel material structures that can be employed in the present application can include semiconductor nanosheets (including, for example, vertically stacked semiconductor channel material nanosheets), semiconductor nanowires (including, for example, vertically stacked semiconductor nanowires), semiconductor fins, or any other like semiconductor channel material structure. The semiconductor channel material structure includes at least one semiconductor material such as, for example, silicon (Si), a silicon germanium (SiGe) alloy, a silicon germanium carbide (SiGeC) alloy, germanium (Ge), a III/V compound semiconductor, an II/VI compound semiconductor or a multilayered stack including at least two semiconductor materials (e.g., a multilayered stack of Si and SiGe). The present application allows works when the semiconductor channel material structure is an upper portion of a semiconductor substrate.

When semiconductor nanosheets are employed, a nanosheet device is provided that includes at least one semiconductor nanosheet and a functional gate structure that is formed on physically exposed surfaces of the at least one semiconductor nanosheet. When semiconductor fins are employed, a finFET device is provided that includes at least one semiconductor fin and a functional gate structure that is formed on physically exposed surfaces of the at least one semiconductor fin. When semiconductor nanowires are employed, a semiconductor nanowire device is provided that includes at least one semiconductor nanowire and a functional gate structure that is formed on physically exposed surfaces of the at least one semiconductor wire. When a semiconductor substrate is employed as the semiconductor channel structure, a planar semiconductor device is provided that includes a functional gate structure located on a semiconductor material surface of the semiconductor substrate.

Figure 2A:
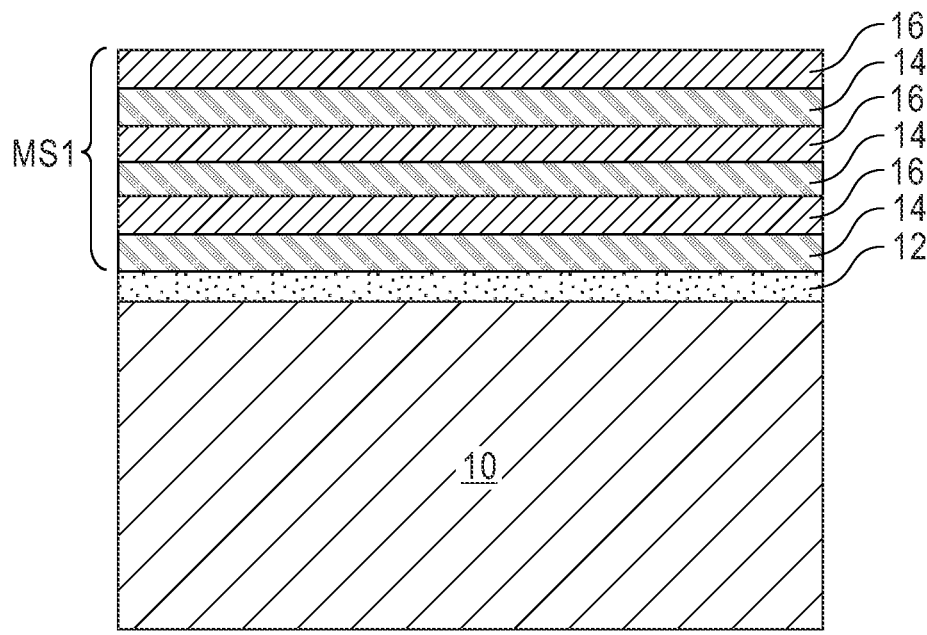
FIGS. 2A and 2B are cross sectional views through X-X and Y-Y, respectively shown in FIG. 1 of an exemplary structure that can be employed in one embodiment of the present application, the exemplary structure including a neighboring pair of material stacks located on a surface of a semiconductor substrate, a shallow trench isolation structure separating active areas of the semiconductor substrate containing each material stack from one another, a buried power rail located in the shallow trench isolation structure, wherein each material stack includes alternating sacrificial semiconductor material layers and semiconductor channel material layers.
Figure 2B:
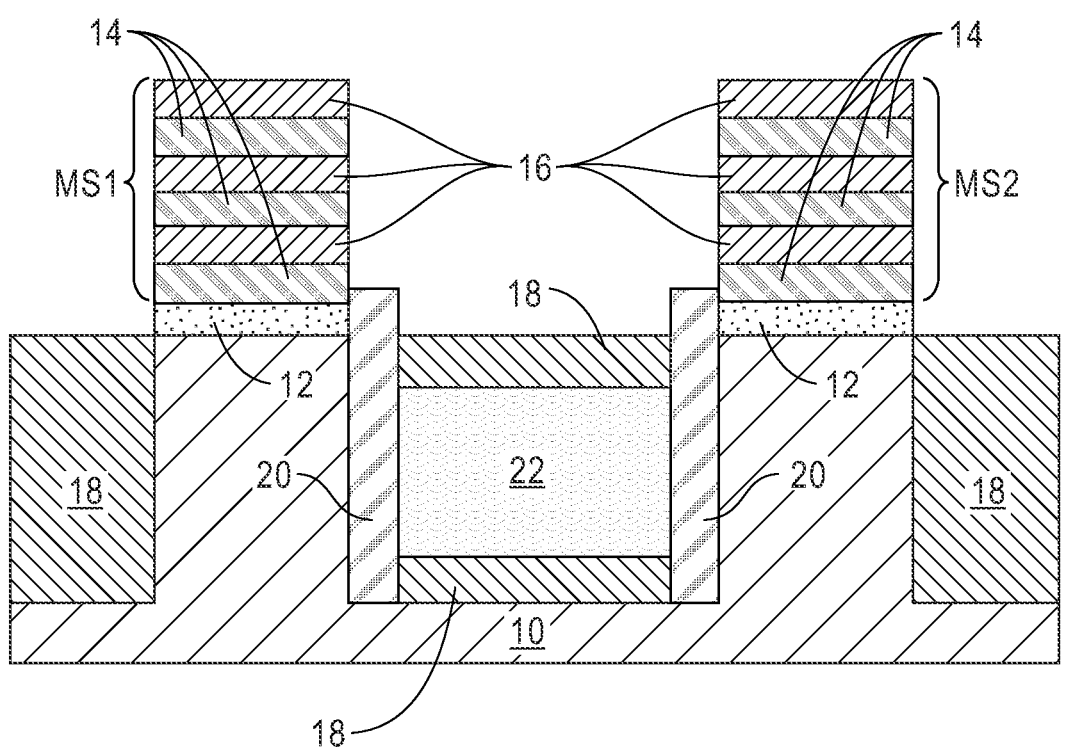

Referring now to FIGS. 2A and 2B, there are illustrated cross sectional views through X-X and Y-Y, respectively shown in FIG. 1 of an exemplary structure that can be employed in one embodiment of the present application. The exemplary structure includes a neighboring pair of material stacks, MS1 and MS2, located on a surface of a semiconductor substrate 10. MS1 denotes a first material stack, while MS2 denotes a second material stack. Although two material stacks are described and illustrated in the present application, the present application is not limited to using only two material stacks; two material stacks represent the lowest number of material stacks that can be employed in the present application.

Each of the first material stack MS1 and the second material stack MS2 is located on an active area of the semiconductor substrate 10 and each active area of the semiconductor substrate 10 denotes a different device region. Each of the first material stack MS1 and the second material stack MS2 includes alternating sacrificial semiconductor material layers 14 and semiconductor channel material layers 16. The number of sacrificial semiconductor material layers 14 and the number of semiconductor channel material layers 16 within each of the first material stack MS1 and the second material stack MS2 is the same. That is, each of the first material stack MS1 and the second material stack MS2 includes 'n' number of sacrificial semiconductor layers 14 and 'n' number of semiconductor channel material layers 16, wherein n is an integer starting from one. By way of one example, each of the first material stack MS1 and the second material stack MS2 includes three sacrificial semiconductor material layers 14 and three semiconductor channel material layers 16.

In some embodiments of the present application, and as is illustrated in FIGS. 2A and 2B, an optional placeholder material layer 12 can be located between each of the first material stack MS1 and a first active area of the semiconductor substrate 10, and the second material stack MS2 and a second active area of the semiconductor substrate 10. In other embodiments, the optional placeholder material layer 12 can be omitted.

The exemplary structure shown in FIGS. 2A and 2B further includes a shallow trench isolation (SIT) structure 18 separating the first active area of the semiconductor substrate 10 containing the first material stack MS1 from the second active area of the semiconductor substrate 10 containing the second material MS2. A buried power rail 22 is located in the shallow trench isolation structure 18 separating the first active area of the semiconductor substrate 10 containing the first material stack MS1 from the second active area of the semiconductor substrate 10 containing the second material MS2.

In some embodiments, a protective spacer 20, which protects the first and second areas from being damaged during further processing, can be located along a sidewall of a trench that includes the buried power rail 22 and the shallow trench isolation structure 18 that separates the first active area of the semiconductor substrate 10 containing the first material stack MS1 (or second material stack MS2) from the buried power rail 22. As is shown in FIG. 2B, the protective spacer 20 has a height that extends above a topmost surface of both the semiconductor substrate 10 and the shallow trench isolation structure 18 that separates the first active area of the semiconductor substrate 10 containing the first material stack MS1 (or the second material stack MS2) from the buried power rail 22. As is further shown in FIG. 2B, the protective spacer 20 can be located on a lower portion of a sidewall of the first material stack MS1 and on a lower portion of a sidewall of the second material stack MS2.

Semiconductor substrate 10 can be composed of one of the semiconductor materials mentioned above for the semiconductor channel material structures. In one embodiment (depicted in the drawings of the present application), the semiconductor substrate is entirely composed of at least one semiconductor material. In such an embodiment, the semiconductor substrate 10 can be referred to as a bulk semiconductor substrate. In other embodiments (not shown in the drawings of the present application), semiconductor substrate 10 can be composed of a first semiconductor material layer, a buried insulator layer such as for example, silicon dioxide and/or boron nitride, and a top semiconductor material layer. In such an embodiment, the semiconductor substrate 10 can be referred to as a semiconductor-on-insulator substrate.

The optional placeholder material layer 12 can be composed of a semiconductor material that is compositionally different from the upper semiconductor material portion of the semiconductor substrate 10, as well as the alternating sacrificial semiconductor material layers 14 and semiconductor channel material layers 16 that are present in each of the first material stack MS1 and the second material stack MS2. In one example, and when the upper semiconductor material portion of the semiconductor substrate 10 and the semiconductor channel material layers 16 are composed of silicon, and the sacrificial semiconductor material layers 14 are composed of a silicon germanium alloy having a first germanium content (such as, for example, 30 atomic percent germanium), the optional placeholder material layer 12 can be composed of a silicon germanium alloy having a second germanium content (such as, for example, 60 atomic percent germanium) that differs from the first germanium content.

Each sacrificial semiconductor material layer 14 in the first material stack MS1 and the second material stack MS2 is composed of a first semiconductor material, while each semiconductor channel material layer 16 in the first material stack MS1 and the second material stack MS2 is composed of a second semiconductor material that is compositionally different from the first semiconductor material. In some embodiments, the second semiconductor material that provides each semiconductor channel material layer 16 in the first material stack MS1 and the second material stack MS2 is a semiconductor material that is capable of providing high channel mobility for n-type FET devices. In other embodiments, the second semiconductor material that provides each semiconductor channel material layer 16 in the first material stack MS1 and the second material stack MS2 is a semiconductor material that is capable of providing high channel mobility for p-type FET devices.

The first semiconductor material that provides each sacrificial semiconductor material layer 14 in the first material stack MS1 and the second material stack MS2, and the second semiconductor material that provides each semiconductor channel material layer 16 in the first material stack MS1 and the second material stack MS2 can include one of the semiconductor materials mentioned above for semiconductor channel material structures. In the present application, the first semiconductor material that provides each sacrificial semiconductor material layer 14 can be compositionally the same as, or compositionally different from, at least an uppermost semiconductor material portion of the semiconductor substrate 10; when an optional placeholder material layer 12 is present, the first semiconductor material that provides each sacrificial semiconductor material layer 14 is compositionally different from the optional placeholder material layer 12. Typically, the first semiconductor material that provides each sacrificial semiconductor material layer 14 is compositionally different from at least the uppermost semiconductor material portion of the semiconductor substrate 10. The second semiconductor material that provides each semiconductor channel material layer 16 can be compositionally the same as, or compositionally different from, at least an uppermost semiconductor material portion of the semiconductor substrate 10; when an optional placeholder material layer 12 is present, the second semiconductor material that provides each semiconductor channel material layer 16 is compositionally different from the optional placeholder material layer 12. Typically, the second semiconductor material that provides each semiconductor channel material layer 16 is compositionally the same as at least the uppermost semiconductor material portion of the semiconductor substrate 10. In one example, the semiconductor substrate 10 is composed silicon, the first semiconductor material that provides each sacrificial semiconductor material layer 14 is composed of a silicon germanium alloy, and the second semiconductor material that provides each semiconductor channel material layer 16 is composed of silicon. Other combinations of semiconductor materials are possible as long as the first semiconductor material that provides each sacrificial semiconductor material layer 14 is compositionally different from the second semiconductor material that provides each semiconductor channel material layer 16.

The shallow trench isolation structure 18 can be composed of trench dielectric material such as, for example, silicon dioxide, silicon nitride, or silicon oxynitride. In some embodiments (not shown in the drawings of the present application), a thin dielectric liner (such as for example, a silicon nitride liner) can be formed along the sidewalls and bottommost surface of the STI structure 18.

The protective spacer 20 can be composed of any dielectric spacer material that is compositionally different from the trench dielectric material. The dielectric spacer material that provides protective spacer 20 can include, but is not limited to, a silicon nitride based dielectric material such as, for example, silicon nitride, silicon boron carbon nitride, or a dielectric including atoms of Si, O, C and N, a silicon carbon based dielectric material such as, for example, silicon carbide or a dielectric including atoms of Si, C and O, or any other dielectric material such as, for example, silicon dioxide.

The buried power rail 22 is composed of a buried power rail conductive material. Exemplary buried power rail conductive materials that can be used in providing the buried power rail 22 include, but are not limited to, tungsten (W), cobalt (Co), ruthenium (Ru), aluminum (Al), copper (Cu), platinum (Pt), rhodium (Rh), or palladium (Pd), with a thin metal adhesion layer (such as TiN, TaN) typically being formed prior to the conductive metal deposition; for clarity, the metal adhesion layer is not separately illustrated in the drawings of the present application.

The exemplary structure shown in FIGS. 2A and 2B can be formed utilizing techniques that are well known to those skilled in the art. In one example, the exemplary structure shown in FIGS. 2A and 2B can be formed by first forming the optional placeholder material layer 12 and the first material stack MS1 and the second material stack MS2 on a surface of the semiconductor substrate 10. Notably, the formation of the optional placeholder material layer 12 and the first material stack MS1 and the second material stack MS2 can include first epitaxially growing a blanket layer of the optional placeholder material, followed by growing alternating blanket layers of sacrificial semiconductor material and semiconductor channel material. In one example, the blanket layer of the optional placeholder material and alternating blanket layers of sacrificial semiconductor material and semiconductor channel material can be deposited utilizing epitaxial growth. The blanket layer of the optional placeholder material and alternating blanket layers of sacrificial semiconductor material and semiconductor channel material are then patterned by lithography and etching to form the optional placeholder material layer 12 and the first material stack MS1 and the second material stack MS2. The etch goes through the blanket layer of optional placeholder material, alternating blanket layers of sacrificial semiconductor material and semiconductor channel material, and into a top portion of the semiconductor substrate 10 forming a STI trench at least between the active areas including the first material stack MS1 and the second material stack MS2.

Protective spacer 20 is then formed into and along sidewalls of the STI trench that is located between first active area containing the first material stack M1 and the second active area containing the second material stack MS2. The protective spacer 20 can be formed by deposition of a spacer dielectric material, followed by a spacer etch. The protective spacer 20 can be pillar shaped as shown in FIG. 2B. The deposition of the spacer dielectric material can include, but is not limited to, chemical vapor deposition (CVD), plasma enhanced chemical vapor deposition (PECVD), physical vapor deposition (PVD) or atomic layer deposition (ALD). The spacer etch can include a reactive ion etch (RIE). Unwanted protective spacer 20 can be removed by a lithography and etch process.

The remaining volume of the STI trench that is located between the first material stack M1 and the second material stack MS2 and the area located laterally adjacent to the first material stack MS1 and the second material stack MS2 is then filled with a trench dielectric material. A planarization process (such as, for example, chemical mechanical polishing (CMP)) and/or densification process can be performed after the trench fill process. The trench dielectric material that is located between the first material stack M1 and the second material stack MS2 is then recessed below the topmost surface of the semiconductor substrate 10.

Buried power rail 22 is then formed on the recessed trench dielectric material that is located between the first active area containing the first material stack M1 and the second active area containing the second material stack MS2. The formation of the buried power rail 22 includes deposition of a buried power rail conductive material, followed by a recess etch. Exemplary deposition processes that can be used to form the buried power rail conductive material include, but are not limited to, CVD, PECVD, PVD, sputtering or platting. The recess etch lowers the height of the deposited buried power rail conductive material and thus provides a buried power rail 22 that has a topmost surface that is located beneath a topmost surface of the semiconductor substrate 10. Additional trench dielectric material is then formed on the buried power rail 22 providing the structures shown in FIG. 2B. The STI structure 18 that is formed between the first and second active areas of the semiconductor substrate 10 has a lower portion and an upper portion in which the buried power rail 22 is sandwiched therebetween. In some embodiments, the bottom surface of the buried power rail 22 can be even deeper than the STI structure 18, and can be present in the semiconductor substrate 10 (not shown). In this case, an additional dielectric liner is needed to separate the buried power rail 22 from the semiconductor substrate 10.

Figure 3A:
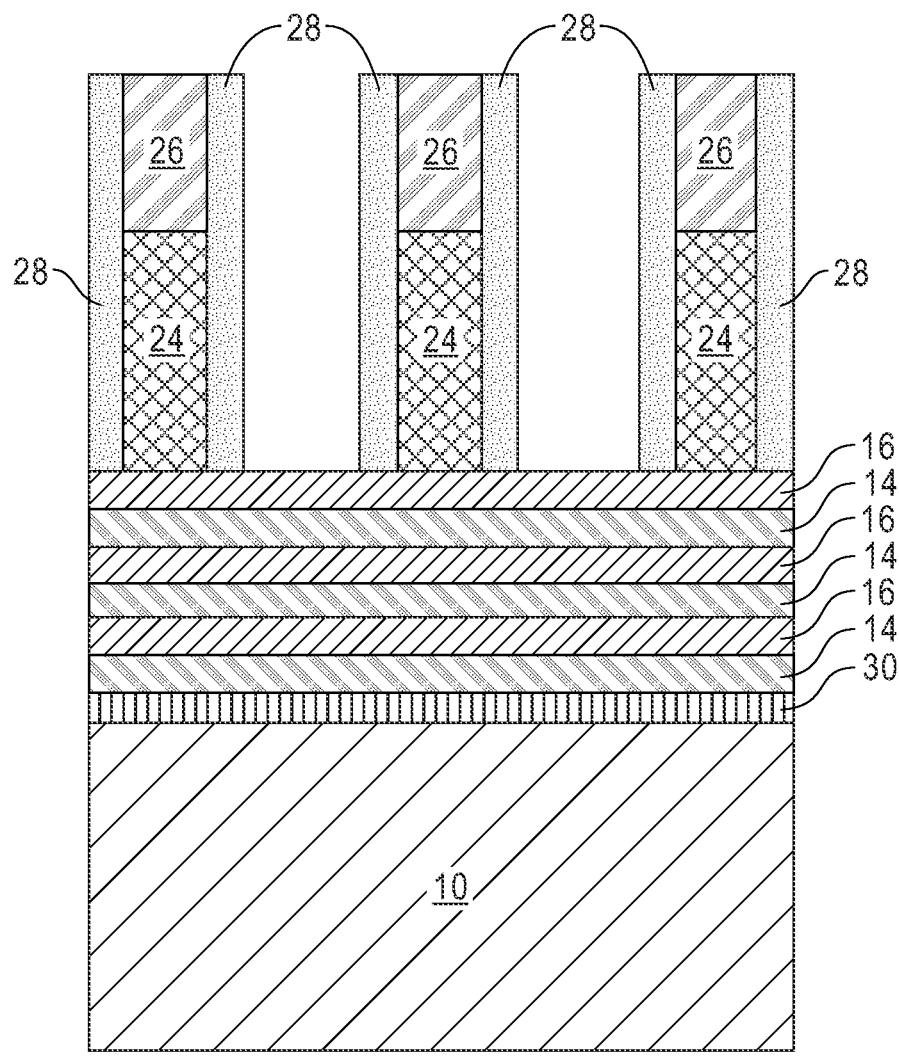
FIGS. 3A and 3B are cross sectional views of the exemplary structure shown in FIGS. 2A and 2B, respectively, after forming a plurality of sacrificial gate structures on physically exposed surfaces of each material stack.
Figure 3B:
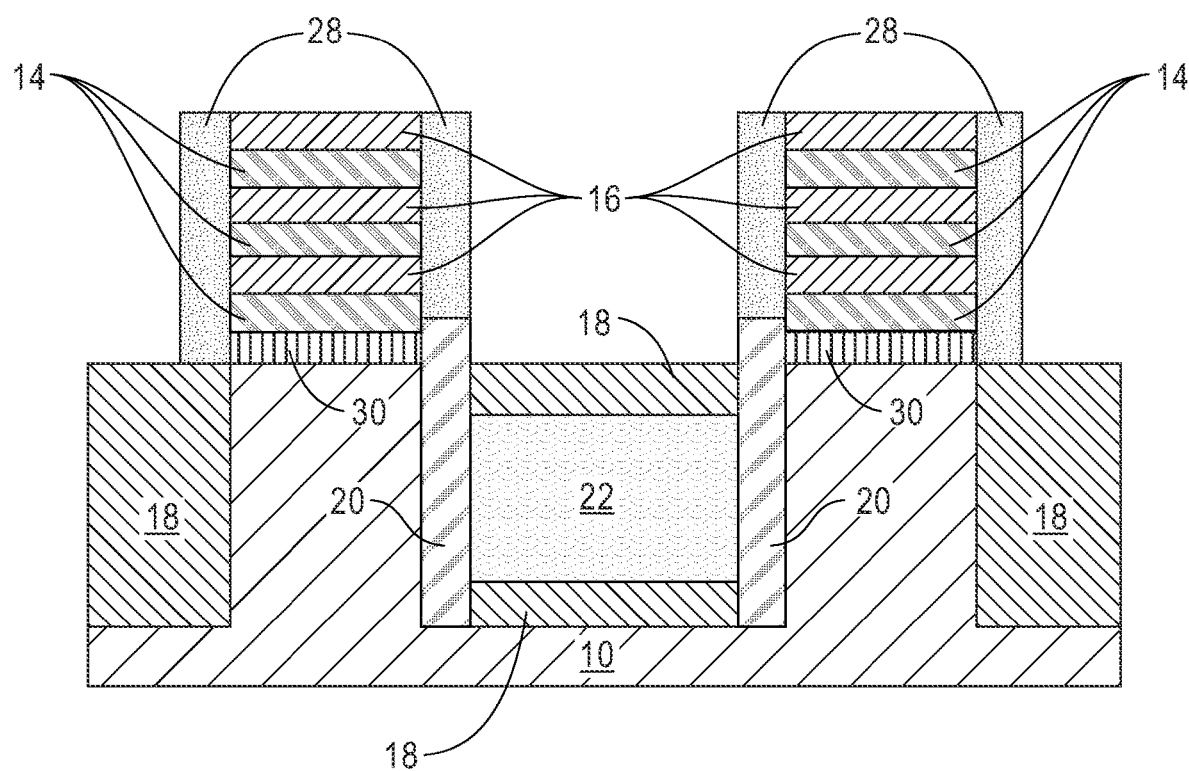

Referring now to FIGS. 3A and 3B, there are illustrated the exemplary structure shown in FIGS. 2A and 2B, respectively, after forming a plurality of sacrificial gate structures 24 on physically exposed surfaces of each material stack (i.e., the first material stack MS1 and the second material stack MS 2). In the exemplary embodiment, each sacrificial gate structure 24 straddles over (i.e., is present on sidewalls and a topmost surface of the first material stack MS1 and the second material stack MS2). By way of one example, three sacrificial gate structures 24 are shown. Although three sacrificial gate structures 24 are shown, the present application works when less than three (i.e., one or two) or greater than three (i.e., 4, 5, 6, etc.) sacrificial gate structures 24 are formed. Each sacrificial gate structure 24 can include a sacrificial gate cap 26 located thereon. Each sacrificial gate structure 24 further includes a dielectric spacer 28 located along the sidewalls thereof; the dielectric spacer 28 is also present on the sidewalls of the first material stack MS1 and the second material stack MS2.

The at least one sacrificial gate structure 24 can be formed by depositing blanket layers of a sacrificial gate dielectric material (such as, for example, silicon dioxide), and a sacrificial gate material (such as, for example, polysilicon or a metal). A blanket layer of a dielectric hard mask material used to provide the sacrificial gate cap 26 such as, for example, silicon nitride, can be deposited on the sacrificial gate material. The depositing of the blanket layers of the dielectric hard mask material, sacrificial gate material, and sacrificial gate dielectric material includes, but is not limited to, CVD, PECVD, PVD, ALD or any combination of such deposition processes. After forming the blanket layers of sacrificial gate dielectric material, sacrificial gate material, and hard mask material, a patterning process (including lithography and etching) is used to convert the blanket layer of hard mask material into sacrificial gate cap 26, and the blanket layers of the sacrificial gate dielectric material and the sacrificial gate dielectric material into sacrificial gate structure 24.

After forming the sacrificial gate structures 24, the optional placeholder material layer 12 is selectively removed forming a void at the bottom of the first material stack MS1 and the second material stack MS2. Next, dielectric spacer 28 is formed by deposition of a dielectric spacer material, followed by a spacer etch. The dielectric spacer material that provides dielectric spacer 28 can include silicon dioxide or silicon nitride. The dielectric spacer 28 will also fill the void at bottom of the first material stack MS1 and the second material stack MS2 forming a bottom dielectric isolation layer 30. Note that the dielectric spacer 28 that is formed along facing sidewalls of the first material stack MS1 and the second material stack MS2 are located on a topmost surface of the protective spacer 20. Along the non-facing sidewalls of the first material stack MS1 and the second material stack MS2, the dielectric spacer 28 is formed on the STI structure 18.

Figure 4A:
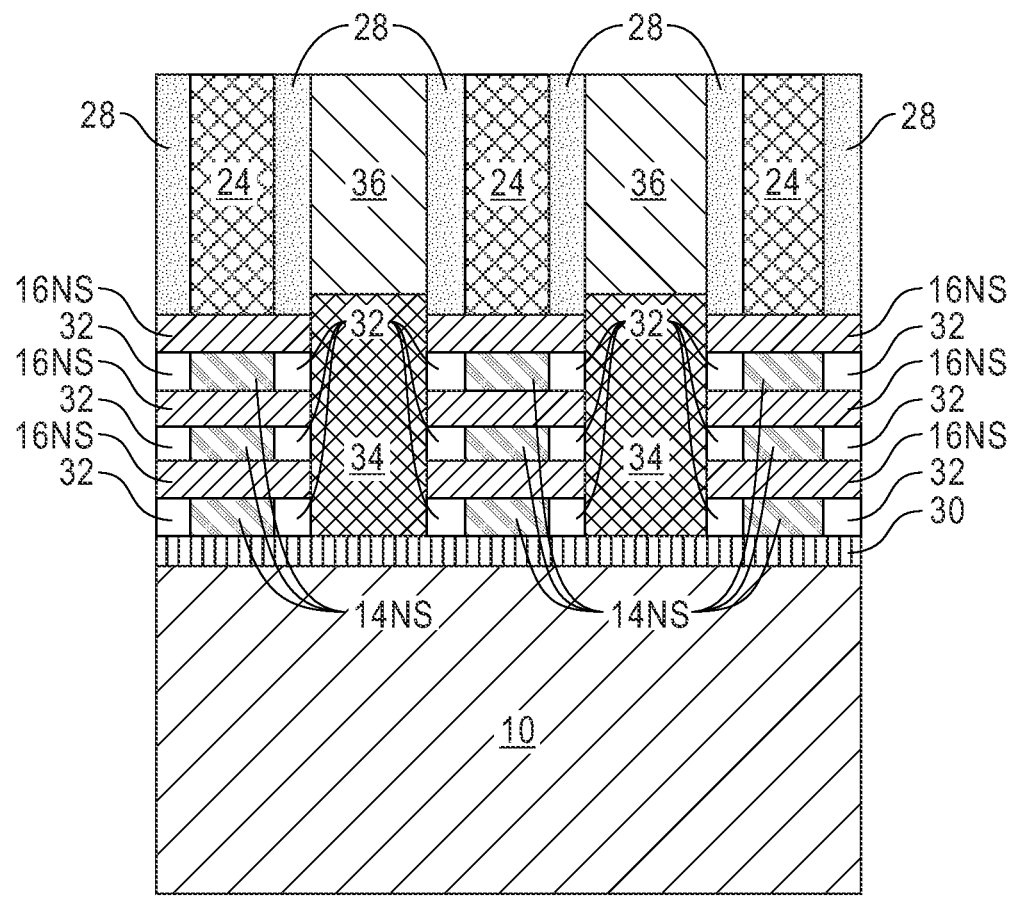
FIGS. 4A and 4B are cross sectional views of the exemplary structure shown in FIGS. 3A and 3B, respectively, after converting each material stack into a nanosheet material stack containing alternating sacrificial semiconductor material nanosheets and semiconductor channel material nanosheets, recessing each sacrificial semiconductor material nanosheet to form a gap, forming an inner spacer in each gap, forming a source/drain region on each side of the sacrificial gate structures, and forming an interlayer dielectric material on each source/drain region.
Figure 4B:
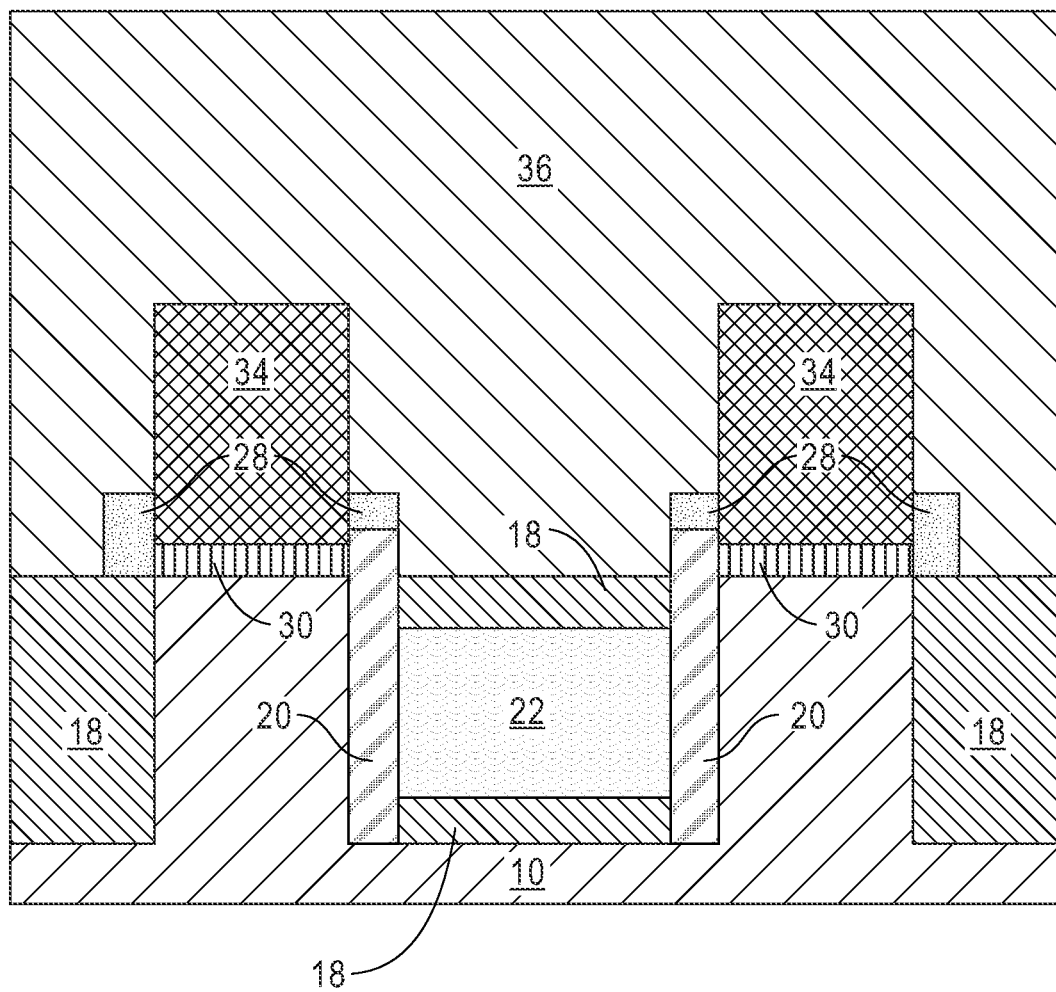

Referring now to FIGS. 4A and 4B, there are illustrated the exemplary structure shown in FIGS. 3A and 3B, respectively, after converting each material stack (i.e., first material stack MS1 and second material stack MS2) into a nanosheet material stack (i.e., a first nanosheet stack and a second nanosheet material stack) containing alternating sacrificial semiconductor material nanosheets 14NS and semiconductor channel material nanosheets 16NS, recessing each sacrificial semiconductor material nanosheet 14NS to form a gap (not show), forming an inner spacer 32 in each gap, forming a source/drain region 34 on each side of the sacrificial gate structures 24, and forming an interlayer dielectric material 36 on each source/drain region 36.

The converting of each material stack (i.e., first material stack MS1 and second material stack MS2) into a nanosheet material stack (i.e., a first nanosheet stack and a second nanosheet material stack containing alternating sacrificial semiconductor material nanosheets 14NS and semiconductor channel material nanosheets 16NS includes a patterning process utilizing the sacrificial gate structures 24 and the dielectric spacer 28 as a combined etch mask. The patterning includes an etching process which removes physically exposed portions of the first material stack MS1 and the second material stack MS2 not protected by the etch mask, while maintaining a portion of the first material stack MS1 and the second material stack MS2 beneath each etch mask. The maintained portion of the first material stack MS1 that is located beneath the etch mask is a first nanosheet stack of alternating sacrificial semiconductor material nanosheets 14NS (i.e., remaining portions of each sacrificial semiconductor material layers 14) and semiconductor channel material nanosheets 16NS (remaining portions of the semiconductor channel material layers 16). The maintained portion of the second material stack MS2 that is located beneath the etch mask is a second nanosheet stack of alternating sacrificial semiconductor material nanosheets 14NS (i.e., remaining portions of each sacrificial semiconductor material layers 14) and semiconductor channel material nanosheets 16NS (remaining portions of the semiconductor channel material layers 16). The etch stops on the bottom dielectric isolation layer 30, if optional placeholder material layer 12 was employed, or on a surface of the semiconductor substrate 10 if the optional placeholder material layer 12 was not employed.

After defining the first and second nanosheet stacks of alternating sacrificial semiconductor material nanosheets 14NS and semiconductor channel material nanosheets 16NS, end portions of the each sacrificial semiconductor material nanosheet 14NS are recessed to form a gap (not show). The recessing includes a lateral etching process. An inner spacer 32 is then formed in the gaps created by the recessing of each sacrificial semiconductor material nanosheet 14NS. The forming of the inner spacer 32 includes conformal deposition of another dielectric spacer material, followed by an isotropic etching. The another dielectric spacer material can be compositionally the same as, or compositionally, different from the dielectric spacer material that provides dielectric spacer 28.

After inner spacer 32 formation, source/drain regions 34 are formed. As used herein, a "source/drain" region can be a source region or a drain region depending on subsequent wiring and application of voltages during operation of the FET. The source/drain regions 34 have a sidewall that is in direct physical contact with the outermost sidewalls of each semiconductor channel material nanosheet. The source/drains 34 are formed on the on surface of the bottom dielectric isolation layer 30. The source/drain regions 34 comprise a semiconductor material and a dopant. The semiconductor material that provides each source/drain region 34 can include one of the semiconductor materials mentioned above for the semiconductor channel material structures. The semiconductor material that provides the source/drain regions 34 can be compositionally the same, or compositionally different from each semiconductor channel material nanosheet 16NS. The semiconductor material that provides the source/drain regions 36 is however compositionally different from each recessed sacrificial semiconductor material nanosheet 14NS.

The dopant that is present in each source/drain region 34 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region 34 can have a dopant concentration of from $4 \times 10^{20}$ atoms/cm$^3$ to $3 \times 10^{21}$ atoms/cm$^3$. In one example, each bottom source/drain region 34 is composed of phosphorus doped silicon.

Each source/drain region 34 can be formed by an epitaxial growth in which the dopants are present during the epitaxial growth process. The source/drain regions 34 grow laterally outward from each semiconductor channel material nanosheet 16SNS. A recess etch can be optionally employed so as to reduce the height of each of the source/drain regions 34.

After source/drain region 34 formation, interlayer dielectric (ILD) material layer 36 is formed; ILD material layer 36 is a sacrificial ILD material layer. The ILD material layer 36 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). Although not shown, the ILD material layer 36 can include a multilayered structure that includes at least two different dielectric materials stacked one atop the other such as, for example, silicon nitride and silicon dioxide. The ILD material layer 36 can be formed by a deposition process such as, for example, CVD, PECVD, or spin-on coating. A planarization process can be performed after the deposition of the dielectric material that provides the ILD material layer 36; this planarization process physically exposes a topmost surface of each sacrificial gate structure 24, removes an upper portion of each dielectric spacer 28, and if present, the optional sacrificial gate cap 26. In the source/drain region shown in FIG. 4B, an upper portion of the dielectric spacer 28 is removed to reveal an upper sidewall portion of each source/drain region 34.

Figure 5A:
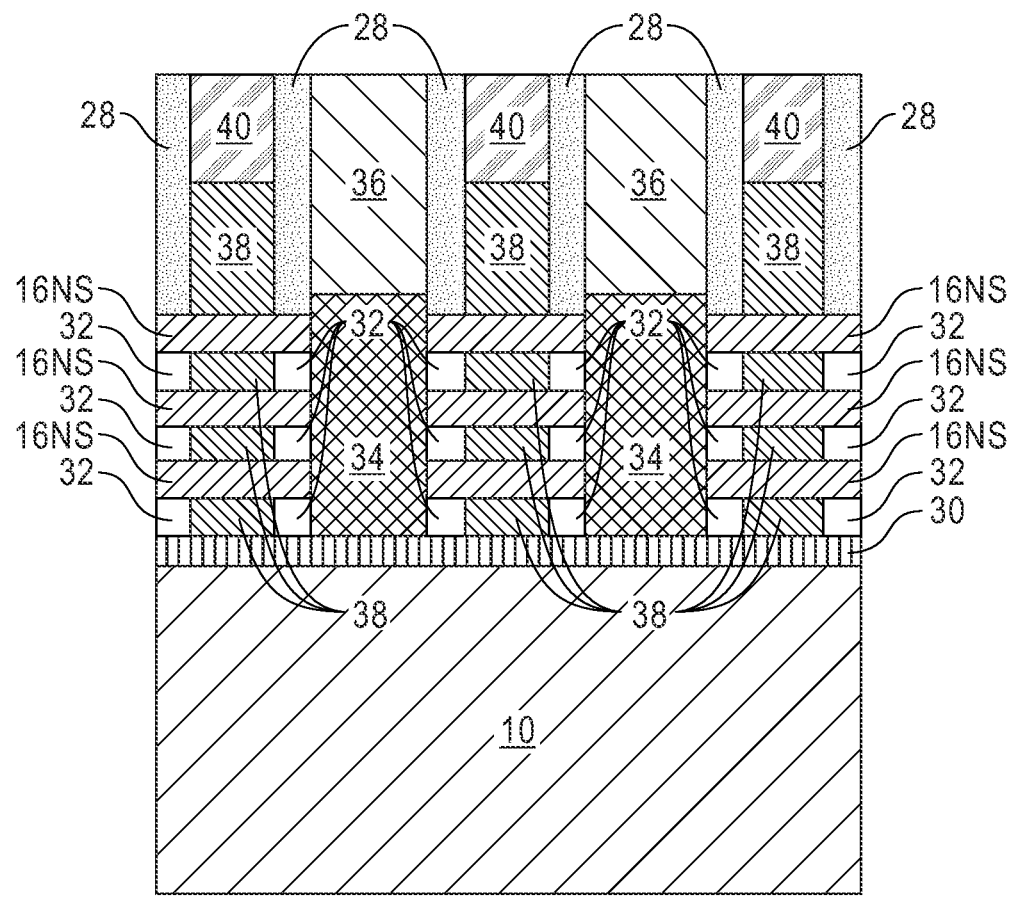
FIGS. 5A and 5B are cross sectional views of the exemplary structure shown in FIGS. 4A and 4B, respectively, after removing each sacrificial gate structure to reveal each nanosheet material stack, removing each recessed sacrificial semiconductor material nanosheet to form a gate cavity and to suspend each semiconductor channel material nanosheet, and forming a functional gate structure in the volume of the gate cavity.
Figure 5B:
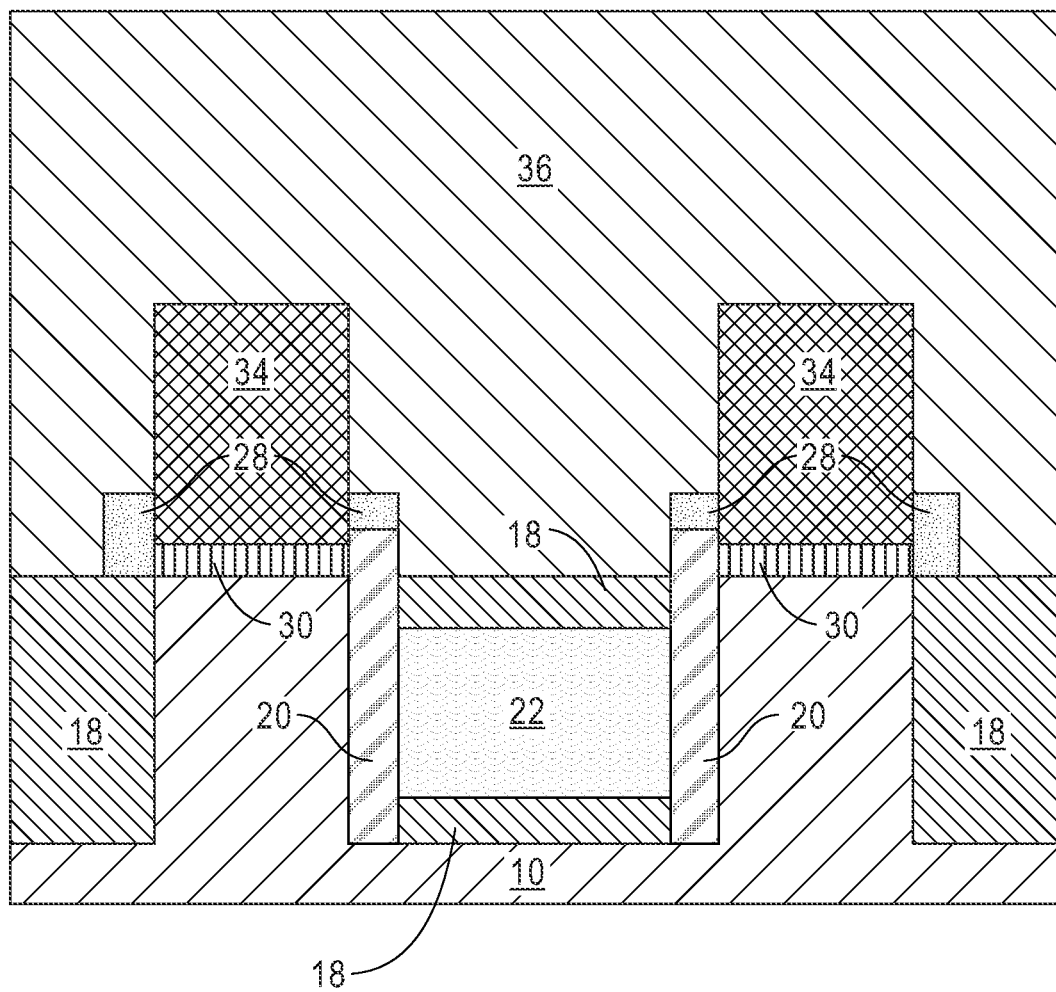

Referring now to FIGS. 5A and 5B, there illustrated the exemplary structure shown in FIGS. 4A and 4B, respectively, after removing each sacrificial gate structure 24 to reveal each nanosheet material stack, removing each recessed sacrificial semiconductor material nanosheet 14NS to form a gate cavity (not shown) and to suspend each semiconductor channel material nanosheet 16NS, and forming a functional gate structure 38 in the volume of the gate cavity.

The removal of the sacrificial gate structures 24 can include one or more etching processes that are selective in removing the sacrificial gate structures 24. The removal of the recessed sacrificial semiconductor material nanosheets 14NS from the nanosheet stacks can be performed utilizing an etch the is selective in removing the sacrificial semiconductor material nanosheets 14NS relative to the semiconductor channel material nanosheets 16NS. For example, and etch can be used to selectively remove SiGe sacrificial semiconductor material nanosheets relative to Si semiconductor channel material nanosheets.

Functional gate structure 38 is then formed in each gate cavity. The functional gate structure 38 includes at least a gate dielectric material layer and a gate electrode; both of which are not individually shown in the drawings of the present application. In some embodiments, the functional gate structure 38 can wrap around each semiconductor channel material nanosheet 16NS within a given vertical stack of suspended semiconductor channel material nanosheets 16NS. As is known, the gate dielectric material layer of the functional gate structure 38 is in direct contact with physically exposed portions of each semiconductor channel material structure, and the gate electrode is located on the gate dielectric material layer. In some embodiments, the functional gate structure 38 includes a work function metal (WFM) layer located between the gate dielectric material layer and the gate electrode. In some embodiments, a gate cap 40 is located above a recessed functional gate structure 38. In other embodiments, the gate cap is omitted.

The functional gate structure 38 includes forming a continuous layer of gate dielectric material and a gate electrode material inside and outside each gate cavity. The continuous layer of gate dielectric material can include silicon oxide, or a dielectric material having a dielectric constant greater than silicon oxide (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb(Sc, Ta)$O_3$), and/or lead zinc niobite (Pb(Zn, Nb)O). The high-k gate dielectric material can further include dopants such as lanthanum (La), aluminum (Al) and/or magnesium (Mg).

The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm. The continuous layer of gate dielectric material does not fill in the entirety of each gate cavity.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_x$), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM can be formed on the continuous layer of gate dielectric material prior to forming the gate electrode material. In other embodiments, the gate electrode is composed of only a WFM. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The layer of WFM is a conformal layer which can be formed by a conformal deposition process such as, for example, ALD, CVD or PECVD. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a planarization process such as, for example, CMP, is used to remove the continuous layer of the gate dielectric material, the optional layer of WFM and the gate electrode material from outside each gate cavity. The remaining continuous layer of the gate dielectric material that is present inside the gate cavity can be referred to as a gate dielectric material layer, the remaining optional layer of WFM that is present inside the gate cavity can be referred to a WFM layer, and remaining gate electrode material that is present inside the gate cavity provides a gate electrode. When present, gate cap 40 can be composed of a hard mask material such as, for example, silicon dioxide or silicon nitride. The gate cap 40 can be formed by a deposition process, followed by a planarization process.

In the illustrated embodiment shown in FIG. 5A, the optional gate cap 40 has a topmost surface that is coplanar with a topmost surface of both the dielectric spacer 28 and the ILD material layer 36. In other embodiments, the functional gate structure 38 has a topmost surface that is coplanar with a topmost surface of both the dielectric spacer 28 and the ILD material layer 36.

Figure 6A:
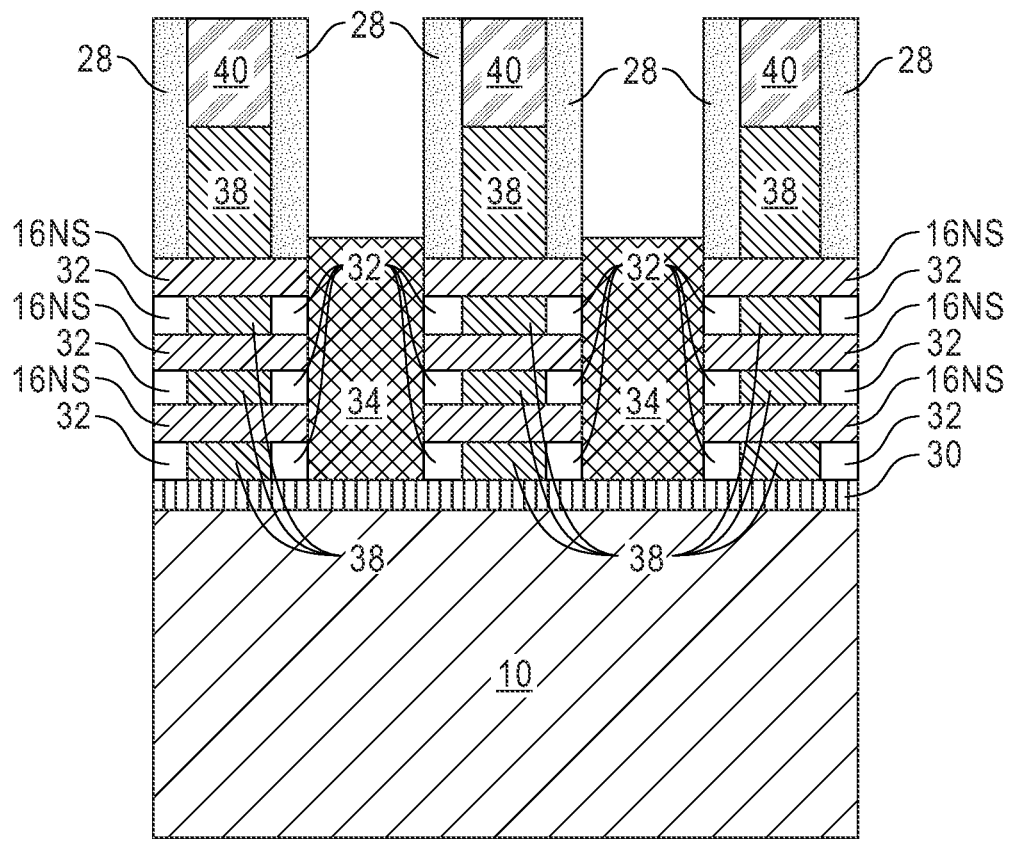
FIGS. 6A and 6B are cross sectional views of the exemplary structure shown in FIGS. 5A and 5B, respectively, after removing the interlayer dielectric material layer and an upper portion of the shallow trench isolation structure to reveal the buried power rail.
Figure 6B:
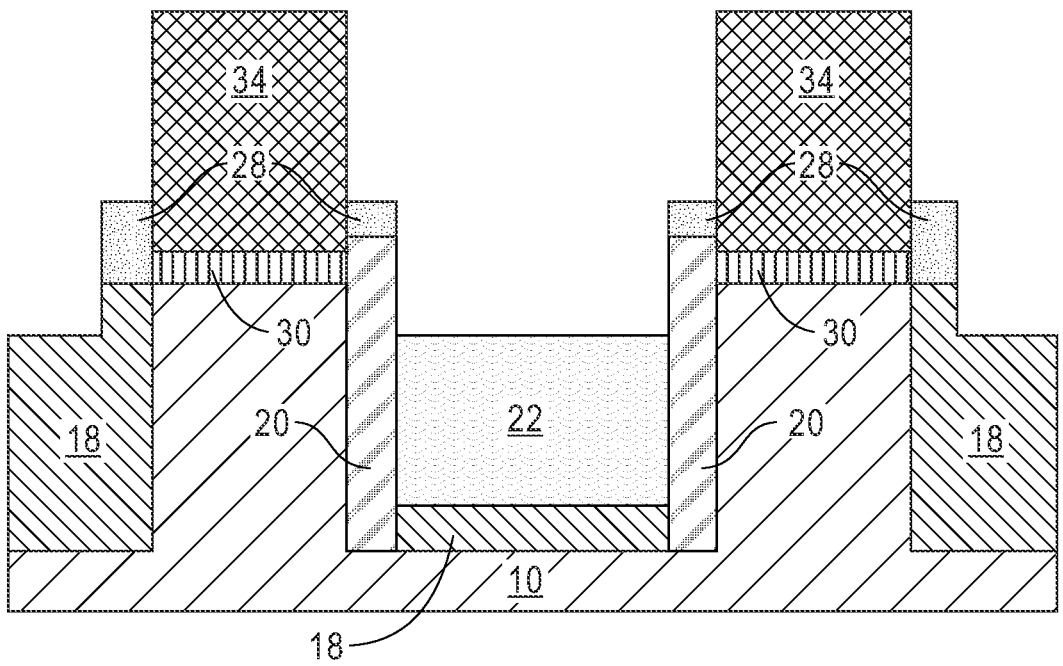

Referring now to FIGS. 6A and 6B, there are illustrated the exemplary structure shown in FIGS. 5A and 5B, respectively, after removing the ILD material layer 36 and an upper portion of the STI structure 18 to reveal the buried power rail 22. The ILD material layer 36 can be removed utilizing a first etch, and then a second etch (typically different from the first etch) can be used to remove the STI structure 18 that is located above the buried power rail 22. In one example, the first etch is an isotropic etch selective in removing the ILD material layer 36, while the second etch is an isotropic etch that is selective in recessing the upper portion of the STI structure 18 that is located on the buried power rail 22. It is noted that during the second etch, STI structures not including a buried power rail 22 are recessed as shown in FIG. 6B.

Figure 7A:
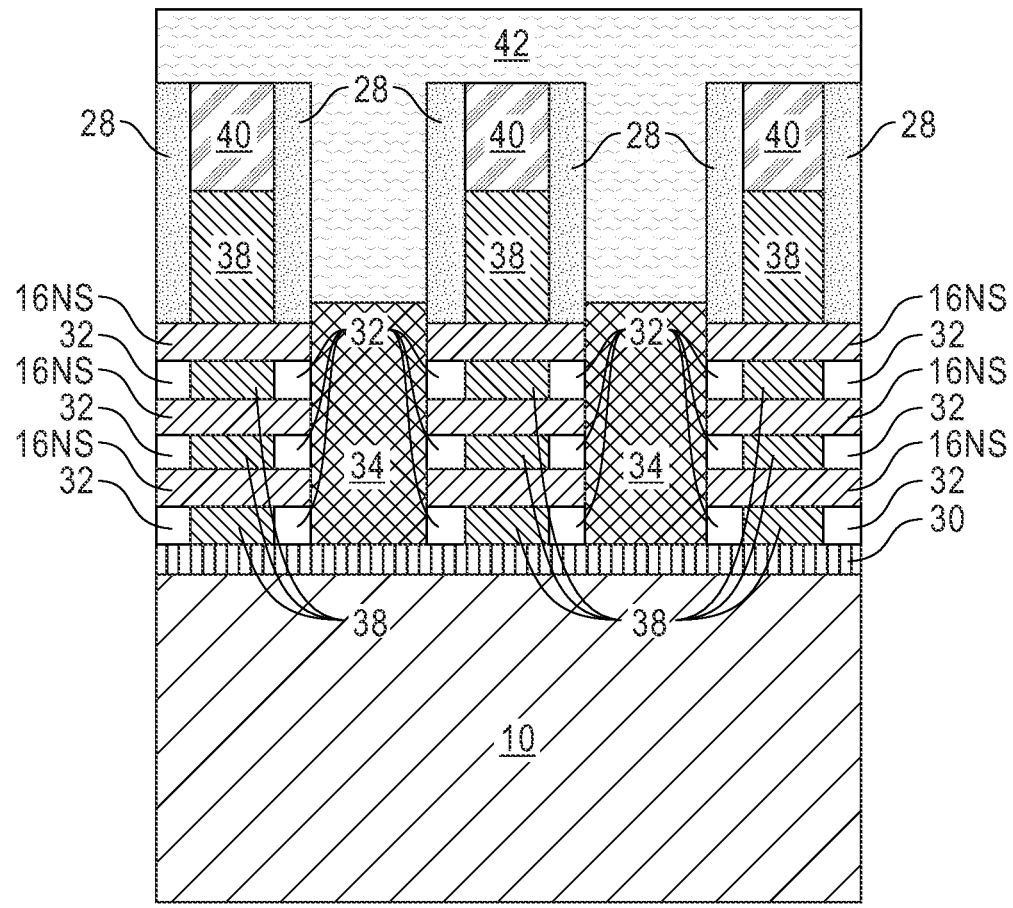
FIGS. 7A and 7B are cross sectional views of the exemplary structure shown in FIGS. 6A and 6B, respectively, after forming at least a contact conductor material layer contacting physically exposed surfaces of each source/drain region and a physically exposed surface of the buried power rail.
Figure 7B:
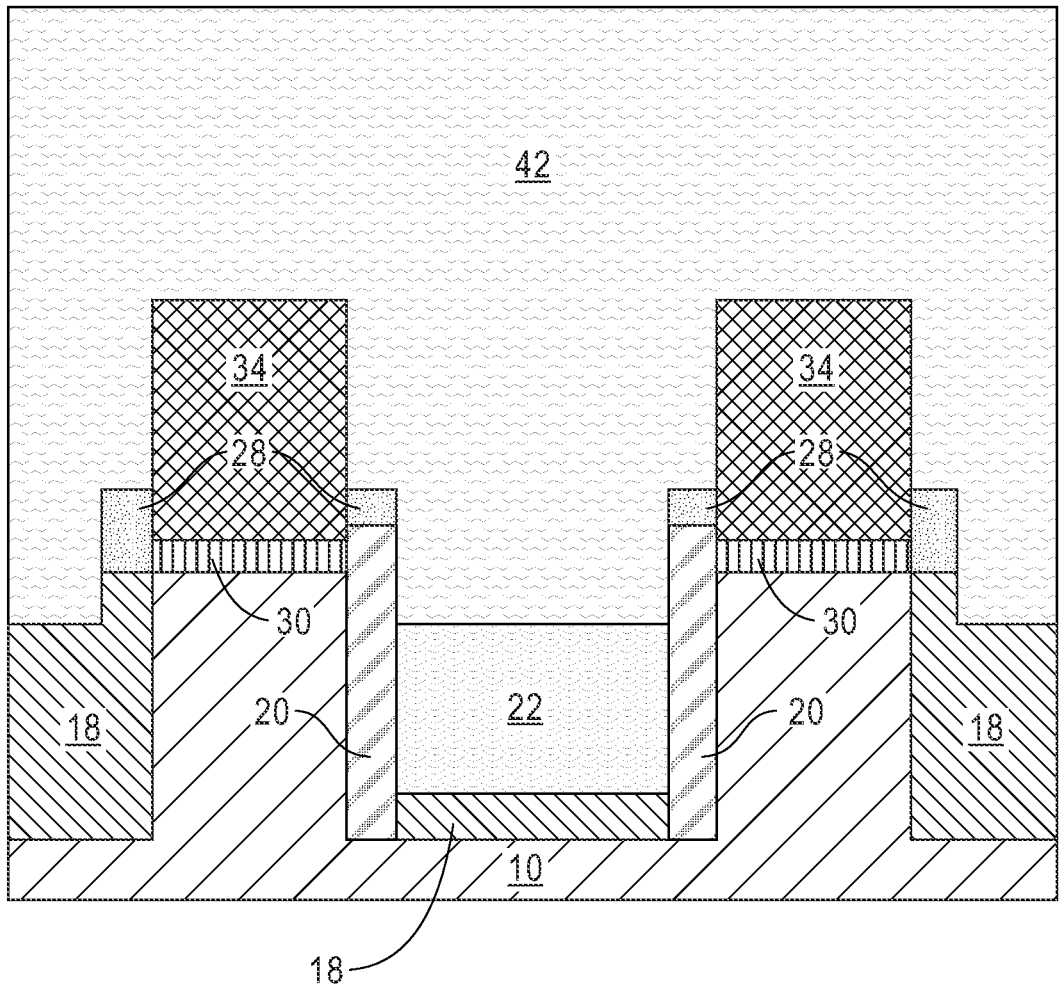

Referring now to FIGS. 7A and 7B, there are illustrated the exemplary structure shown in FIGS. 6A and 6B, respectively, after forming at least a contact conductor material layer 42 contacting physically exposed surfaces (including sidewalls and a topmost surface) of each source/drain region 34 and a physically exposed surface of the buried power rail 22. The contact conductor material layer 42 includes a silicide liner (not shown) such as Ti, Ni, or NiPt over the source/drain regions 34, followed by an adhesion metal liner (also not shown), such as TiN, and then followed by depositing a low resistance contact conductor material such as, for example, W, Cu, Al, Co, Ru, Mo, Os, Ir, Rh or an alloy thereof. The contact conductor material layer 42 can be formed by any suitable deposition method such as, for example, ALD, CVD, PVD or plating. The contact conductor material layer 42 is formed over each gate capped (or uncapped) functional gate structure 38, dielectric spacer 28 and over each source/drain region 34.

Figure 8A:
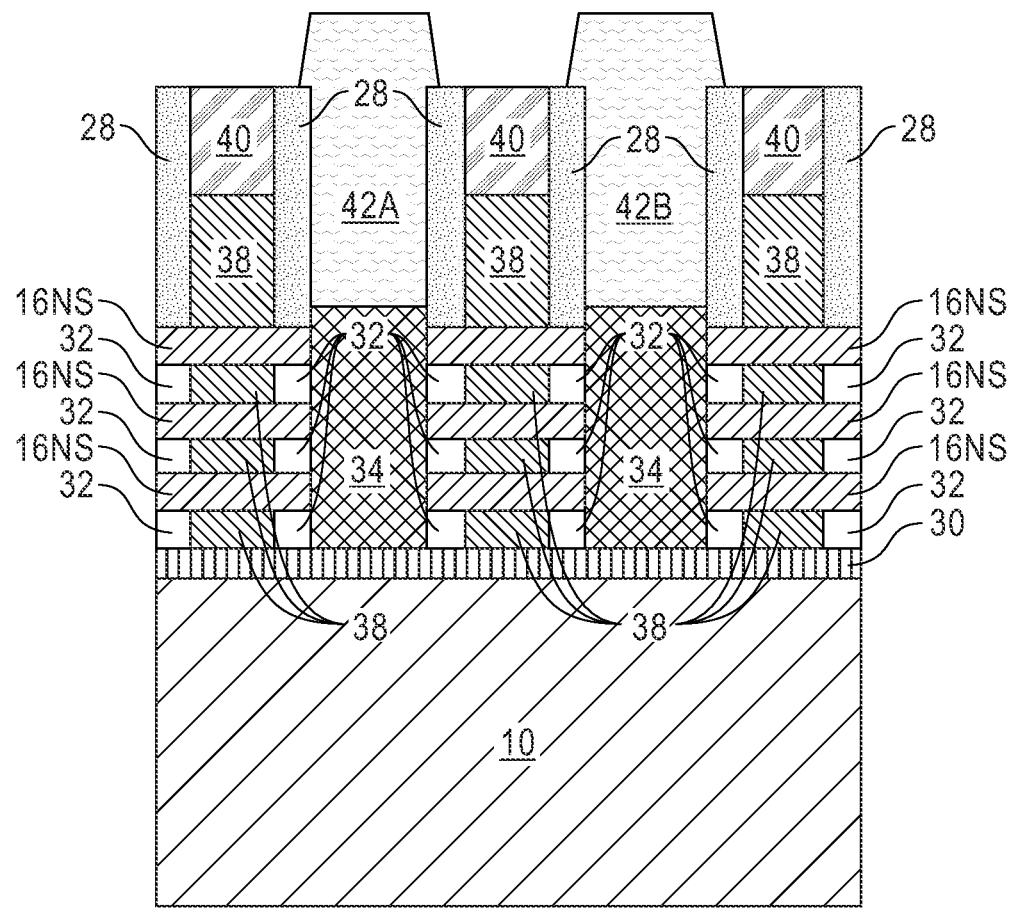
FIGS. 8A and 8B are cross sectional views of the exemplary structure shown in FIGS. 7A and 7B, respectively, after patterning the contact conductor material layer to provide a precursor buried power contact structure and a source/drain contact structure.
Figure 8B:
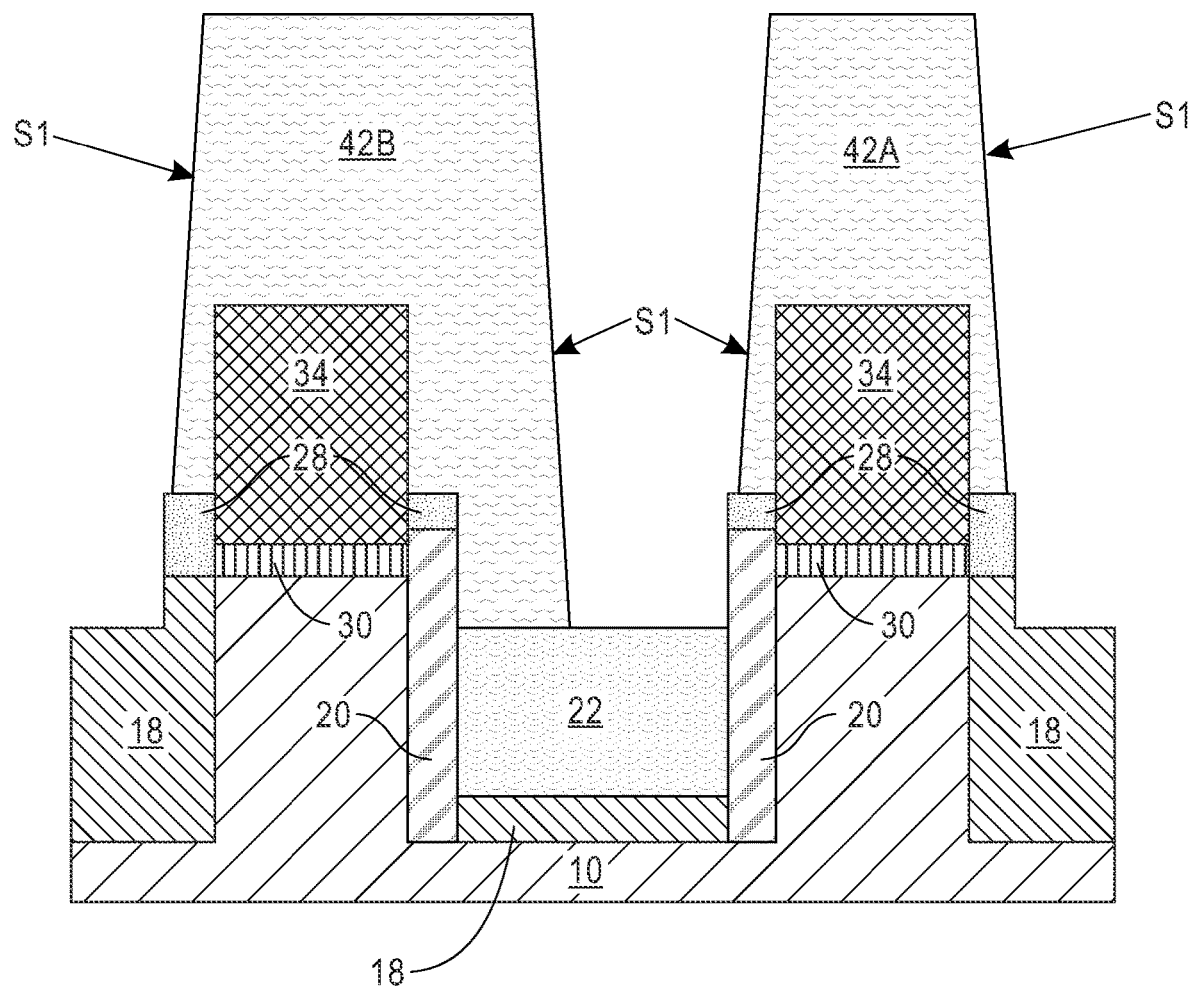

Referring now to FIGS. 8A and 8B, there are illustrated the exemplary structure shown in FIGS. 7A and 7B, respectively, after patterning the contact conductor material layer 42 to provide a precursor buried power rail contact structure 42B and a source/drain contact structure 42A. Patterning of the contact conductor material layer 42 includes a subtractive metal etch process in which a patterned masking layer (not shown) such as, for example, an organic planarization layer (OPL) is formed over portions of the contact conductor material layer 42 in which the precursor buried power rail contact structure 42B and the source/drain contact structure 42A are to be formed. The patterned masking layer can be formed by deposition of a masking material layer, and thereafter patterning the deposited masking material layer by lithography and etching. With the patterning masking layer in place, a subtractive metal etch that is selective in removing a contact conductor material is employed. This etch provides precursor buried power rail contact structure 42B and the source/drain contact structure 42A. The patterned masking layer is removed after the subtractive metal etch has been employed utilizing a conventional material removal process.

Each of the precursor buried power rail contact structure 42B and the source/drain contact structure 42A has a negative taper. That is, each of the precursor buried power rail contact structure 42B and the source/drain contact structure 42A has outermost sidewalls Si (i.e., a first sidewall and a second sidewall opposite the first sidewall) that slope outward from a topmost surface of the contact structure to a bottommost surface of the contact structure. Moreover, each of the precursor buried power rail contact structure 42B and the source/drain contact structure 42A has an upper portion and a bottom portion, wherein the upper portion has a width that is less than a width of the bottom portion. Each of the precursor buried power rail contact structure 42B and the source/drain contact structure 42A thus is pyramidal in shape having a base (lower portion) that is wider than the upper portion.

As is shown in FIG. 8B, the precursor buried power rail contact structure 42B contacts a topmost surface of the buried power rail 22, and the outermost sidewalls Si (i.e., a first sidewall and a second sidewall opposite the first sidewall) of one of the source/drain regions 34. Thus, the precursor buried power rail contact structure 42B can be referred to as a wrap-around contact structure. The precursor buried power rail contact structure 42B that lands on the topmost surface of the buried power rail 22 has a larger contact area (i.e., larger critical dimension, CD) than conventional VBPR contact structures. The source/drain contact structure 42A contacts the outermost sidewalls Si (i.e., a first sidewall and a second sidewall opposite the first sidewall) and a topmost surface of another of the source/drain regions. Thus, the source/drain contact structure 42A can also be referred to as a wrap-around contact structure.

Figure 9A:
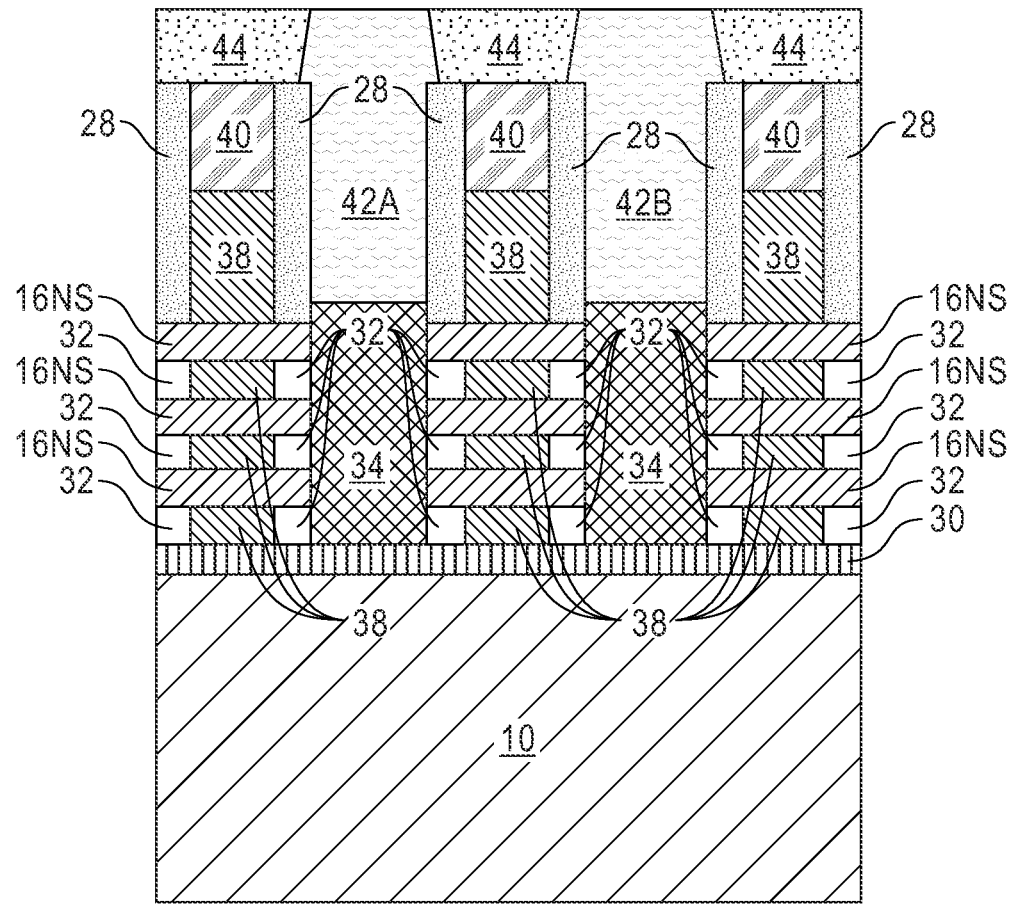
FIGS. 9A and 9B are cross sectional views of the exemplary structure shown in FIGS. 8A and 8B, respectively, after forming another interlayer dielectric material layer.
Figure 9B:
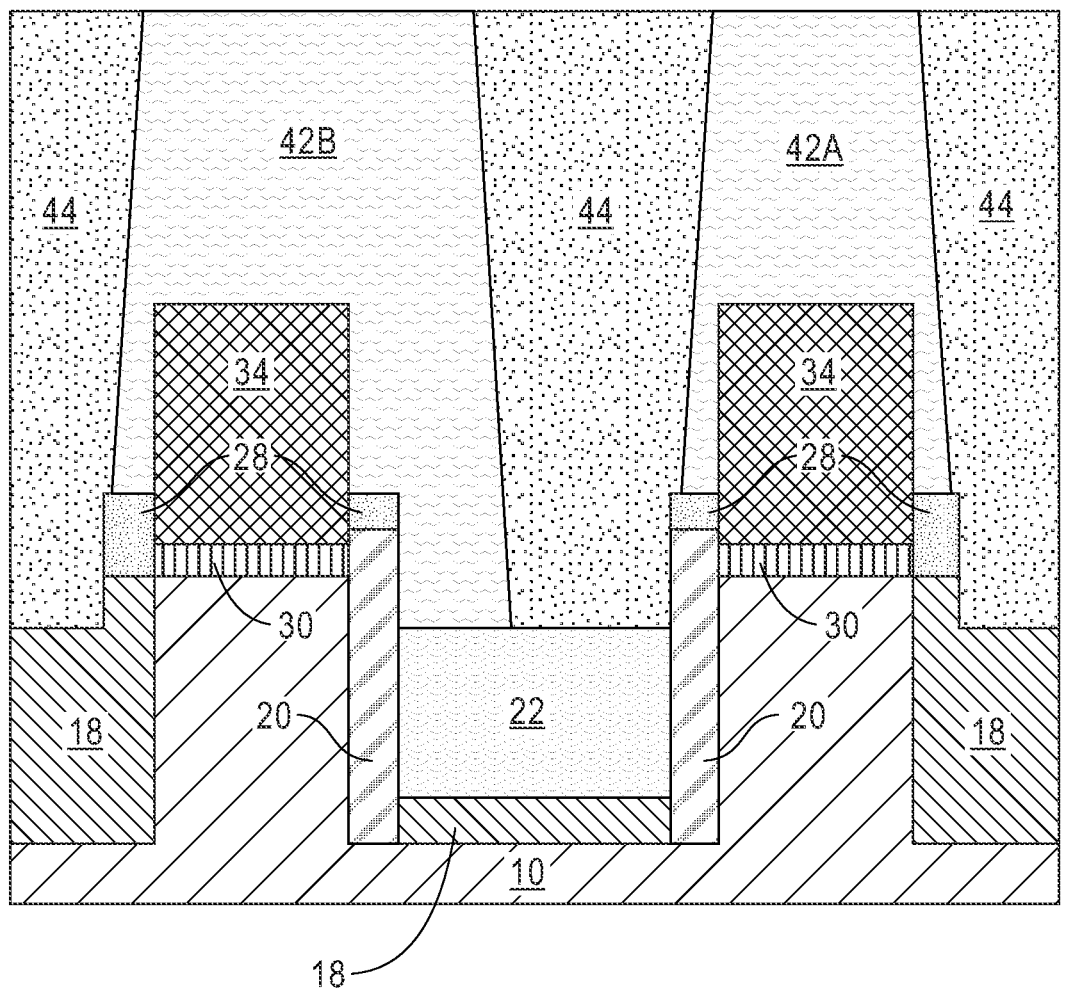

Referring now to FIGS. 9A and 9B, there are illustrated the exemplary structure shown in FIGS. 8A and 8B, respectively, after forming another interlayer dielectric (ILD) material layer 44. The another ILD material layer 44 can include one of the dielectric materials mentioned above for ILD material layer 36. The another ILD material layer 44 can be formed utilizing one of the deposition processes mentioned above for forming ILD material layer 36. A planarization process such as, for example, chemical mechanical polishing (CMP), can follow the deposition of the dielectric material that provides the another dielectric material layer 44. At this point of the present application, the another ILD material layer 44 has a topmost surface that is coplanar with a topmost surface of both the precursor buried power rail contact structure 42B and a source/drain contact structure 42A.

Figure 10A:
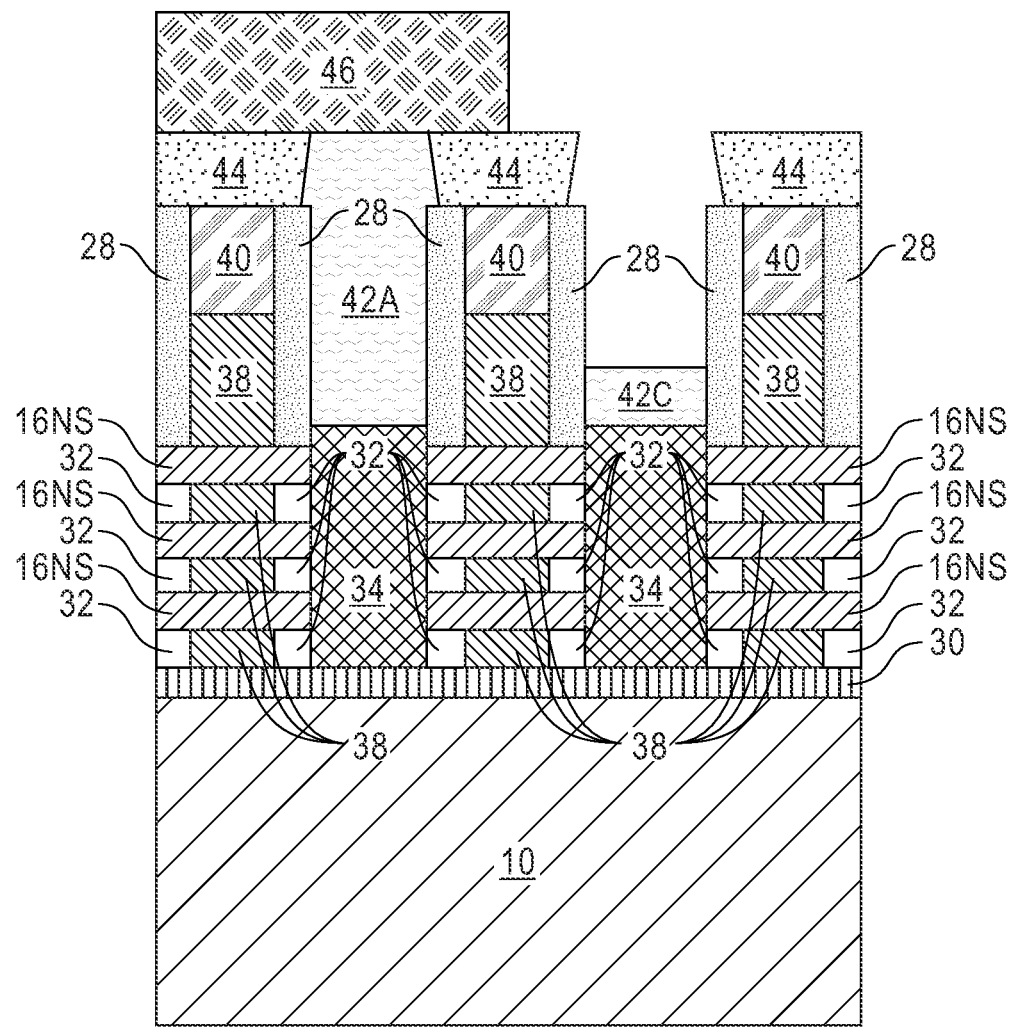
FIGS. 10A and 10B are cross sectional views of the exemplary structure shown in FIGS. 9A and 9B, respectively, after recessing the precursor buried power rail contact structure, but not the source/drain contact structure, to provide a buried power rail contact structure, wherein the buried power rail contact structure has a reduced height as compared to a height of the source/drain contact structure.
Figure 10B:
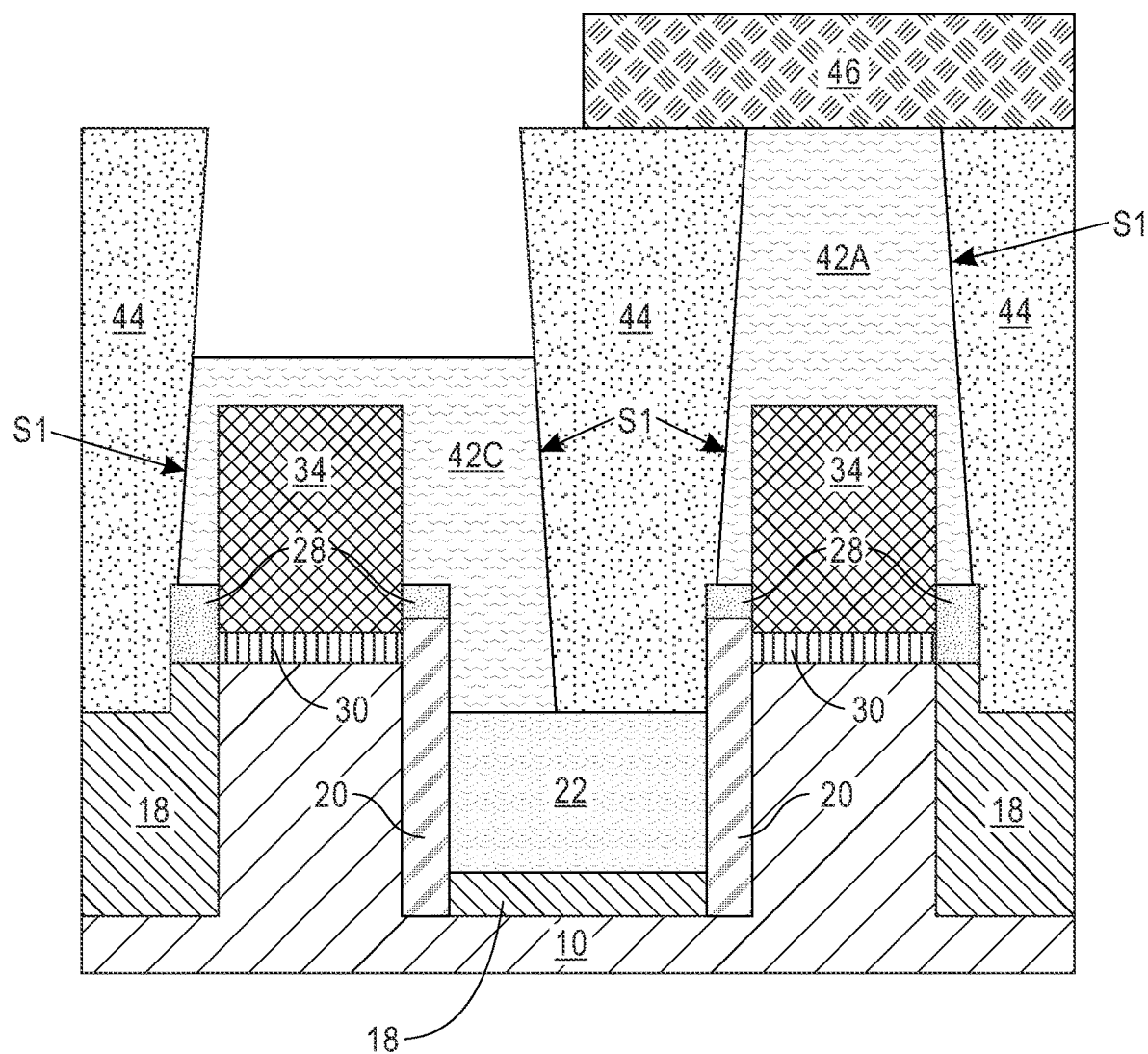

Referring now to FIGS. 10A and 10B, there are illustrated the exemplary structure shown in FIGS. 9A and 9B, respectively, after recessing the precursor buried power rail contact structure 42B, but not the source/drain contact structure 42A, to provide a buried power rail contact structure 42C. The buried power rail contact structure 42C has a reduced height as compared to a height of the source/drain contact structure 42A. That is, the buried power rail contact structure 42C has a topmost surface that is vertically offset from, and located beneath, a topmost surface of the source/drain contact structure 42A.

The recessing step used to provide the exemplary structure shown in FIGS. 10A and 10B includes first forming a patterned masking layer 46 such as, for example, an organic planarization layer (OPL) over portions of the exemplary structure not including the precursor buried power rail contact structure 42B; the patterned masking layer 46 is located over the source/drain contact structure 42A. The patterned masking layer 46 can be formed by deposition, lithography and etching. With the patterning masking layer 46 in place, a recess metal etch that is selective in removing a contact conductor material is employed. This recess etch provides buried power rail contact structure 42C. After the recess etch, the patterned masking layer 46 is removed utilizing a conventional material removal process.

The buried power rail contact structure 42C has a negative taper. That is, the buried power rail contact structure 42C has outermost sidewalls Si (i.e., a first sidewall and a second sidewall opposite the first sidewall) that slope outward from a topmost surface of the contact structure to a bottommost surface of the contact structure. Moreover, the buried power rail contact structure 42C has an upper portion and a bottom portion, wherein the upper portion has a width that is less than a width of the bottom portion. The buried power rail contact structure 42C thus is pyramidal in shape having a base (lower portion) that is wider than the upper portion. As is shown in FIG. 10B, the buried power rail contact structure 42C contacts a topmost surface of the buried power rail 22, and the outermost sidewalls S1 (i.e., a first sidewall and a second sidewall opposite the first sidewall) of one of the source/drain regions 34. Thus, the buried power rail contact structure 42C can be referred to as a wrap-around contact structure. The buried power rail contact structure 42C lands on a first portion of the buried power rail 22, while the ILD material layer 44 lands on a second portion of the buried power rail 22. The buried power rail contact structure 42C that lands on the topmost surface of the buried power rail 22 has a larger contact area than conventional VBPR contact structures. Because of the negative taper in both the buried power rail contact structure 42C and the source/drain contact structure 42A, and the vertical offset between the topmost surface of the buried power rail contact structure 42C and the source/drain contact structure 42A, middle-of-the-line (MOL) congestion, which is problematic with conventional contact structures and conventional VBPR contact structures, is mitigated. Moreover, and due to the negative taper in both the buried power rail contact structure 42C and the source/drain contact structure 42A, and the vertical offset between the topmost surface of the buried power rail contact structure 42C and the source/drain contact structure 42A, parasitic capacitance between the functional gate structures and the contact structure of the present application (i.e., the buried power rail contact structure 42C and the source/drain contact structure 42A) is reduced.

Figure 11A:
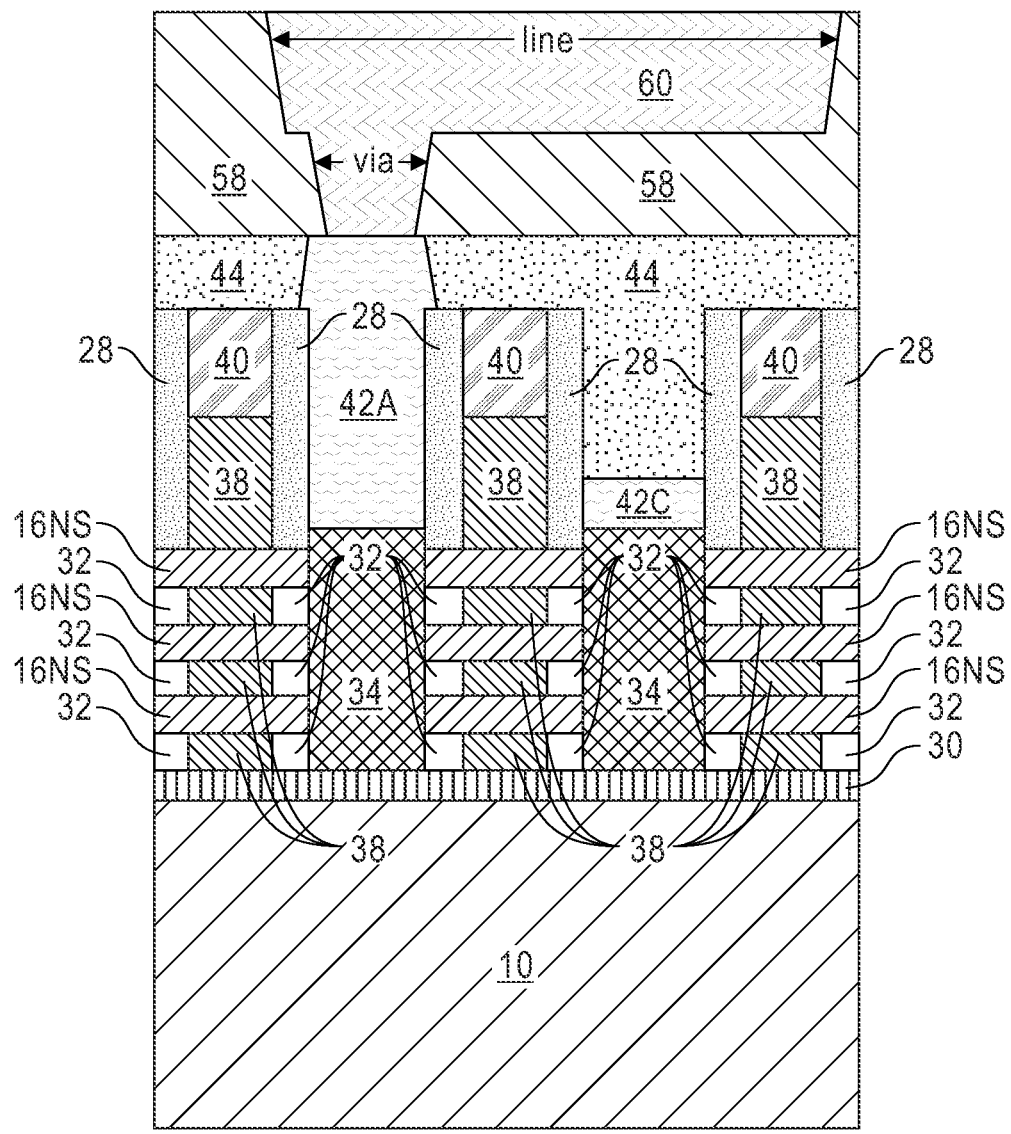
FIGS. 11A and 11B are cross sectional views of the exemplary structure shown in FIGS. 10A and 10B, respectively, after forming an interconnect structure, wherein the interconnect structure includes electrically conductive structures embedded in an interconnect dielectric material layer, wherein one of the electrically conductive structures contacts a surface of the source/drain contact structure.
Figure 11B:
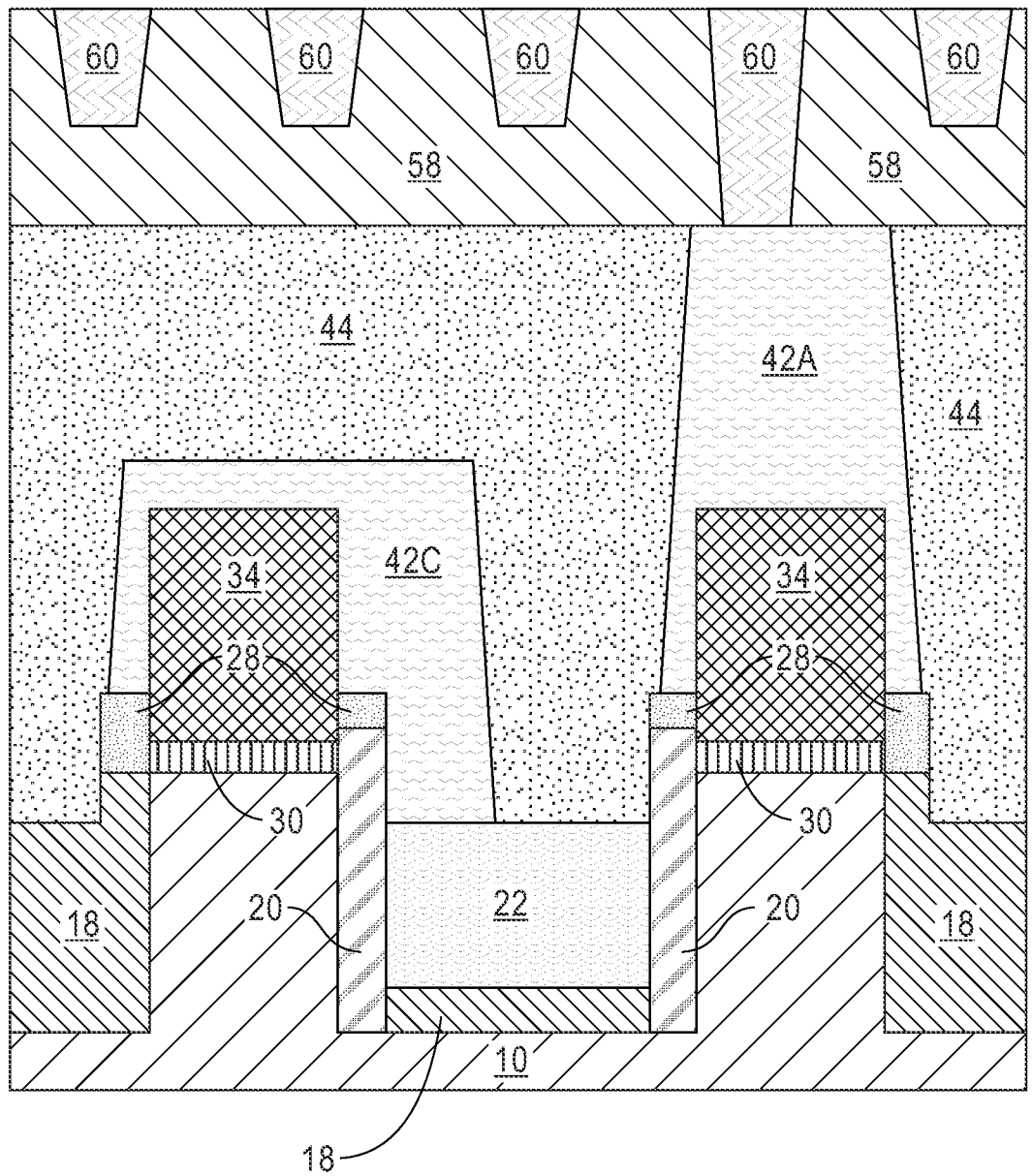

Referring now to FIGS. 11A and 11B, there are illustrated the exemplary structure shown in FIGS. 10A and 10B, respectively, after forming an interconnect structure, wherein the interconnect structure includes electrically conductive structures 60 embedded in an interconnect dielectric material layer 58, wherein one of the electrically conductive structures 60 contacts a surface of the source/drain contact structure 42A. The electrically conductor structure 60 that contacts the source/drain contact structure 42A can have a lower via portion and an upper line portion as shown in FIG. 11A.

Prior to forming the interconnect structure, additional dielectric material that is typically compositionally the same as the dielectric material that provides the ILD material layer 44 is formed on top of the buried power rail contact structure 42C. In the present application, the additional dielectric material that forms on top of the buried power rail contact structure 42C forms a part of the ILD material layer 44. See FIGS. 11A and 11B. In accordance with the present application, the buried power rail contact structure 42C is laterally surrounded and covered with ILD material layer 44 such that a topmost surface of the buried power rail contact structure 42C is vertically offset from, and located entirely beneath a topmost surface of the ILD material layer 44; i.e., buried power rail contact structure 42C is entirely embedded in the ILD material layer 44. The source/drain contact structure 42 is also laterally surrounded by the ILD material layer 44. However, and unlike the buried power rail contact structure 42C, the source/drain contact structure 42A has a topmost surface that is coplanar with a topmost surface of the ILD material layer 44. No electrically conductive structure from the interconnect structure directly contacts the buried power rail contact structure 42C.

The interconnect structure, which is present in the BEOL, is formed utilizing techniques well known to those skilled in the art. For example, the interconnect structure can be formed utilizing a single damascene or a dual damascene process. For example, the interconnect dielectric material layer 58 can be first deposited, and thereafter at least one iteration of lithography and etching can be used to define openings (i.e., vias, lines or combined vias/lines) in the interconnect dielectric material layer 58. An electrically conductive material, which provides each electrically conductive structure 60 such as, for example Cu, Co or Ru is then formed into each opening and a planarization process such as CMP can be used to remove any electrically conductive material that is located outside the openings. The interconnect dielectric material layer 58 can include one of the dielectric materials mentioned above for the ILD material layer 36. In some embodiments, not shown, a diffusion barrier liner composed of a diffusion barrier material such as, for example, Ta, Ti, TaN, TiN or combinations thereof, can be formed and present along a sidewall and a bottommost surface of each electrically conductive structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a first functional gate structure having a first source/drain region and located in a first active area of a semiconductor substrate;
a second functional gate structure having a second source/drain region and located in a second active area of the semiconductor substrate;
a shallow trench isolation structure separating the first active area of the semiconductor substrate from the second active area of the semiconductor substrate;
a buried power rail located between the first active area and the second active area and beneath a topmost surface of the shallow trench isolation structure;
a buried power rail contact structure having a negative taper and contacting the buried power rail and the first source/drain region;
a source/drain contact structure having a negative taper and contacting the second source/drain region, wherein the buried power rail contact structure has a topmost surface that is vertically offset from, and located beneath, a topmost surface of the source/drain contact structure; and
an interlayer dielectric material layer located laterally adjacent to, and above, the buried power rail contact structure and laterally adjacent to the source/drain contact structure, wherein the buried power rail contact structure contacts a first portion of the buried power rail, and the interlayer dielectric material layer contacts a second portion of the buried power rail, and the interlayer dielectric material layer has a topmost surface that is coplanar with a topmost surface of the source/drain contact structure.

2. The semiconductor structure of claim 1, wherein the buried power rail contact structure is a wrap-around contact contacting an upper portion of outermost sidewalls of the first source/drain region and a topmost surface of the first source/drain region.

3. The semiconductor structure of claim 2, further comprising a dielectric spacer contacting a lower portion of the outermost sidewalls of the first source/drain region.

4. The semiconductor structure of claim 1, wherein the source/drain contact structure is a wrap-around contact contacting an upper portion of outermost sidewalls of the second source/drain region and a topmost surface of the second source/drain region.

5. The semiconductor structure of claim 4, further comprising a dielectric spacer contacting a lower portion of the outermost sidewalls of the second source/drain region.

6. The semiconductor structure of claim 1, further comprising a protective spacer located between sidewalls of the buried power rail and the first active area of the semiconductor substrate and the second active area of the semiconductor substrate.

7. The semiconductor structure of claim 6, wherein the protective spacer has a topmost surface that extends above a topmost surface of the semiconductor substrate and contacts a lower portion of the outermost sidewalls of both the first source/drain region and the second source/drain region.

8. The semiconductor structure of claim 1, further comprising a bottom dielectric isolation layer located beneath each of the first functional gate structure, the first source/drain region, the second functional gate structure, and the second source/drain region.

9. The semiconductor structure of claim 1, wherein each of the first functional gate structure and the second functional gate structure contacts a surface of a semiconductor channel material structure.

10. The semiconductor structure of claim 9, wherein the semiconductor channel material structure comprises at least one semiconductor channel material nanosheet, and wherein the first functional gate structure wraps around the at least one semiconductor channel material nanosheet present in the first active area, and wherein the second functional gate structure wraps around the at least one semiconductor channel material nanosheet present in the second active area.

11. The semiconductor structure of claim 1, further comprising an interconnect structure located above the first functional gate structure and the second functional gate structure.

12. The semiconductor structure of claim 11, wherein the interconnect structure comprises an electrically conductive structure embedded in an interconnect dielectric material layer, wherein the electrically conductive structure contacts a surface of the source/drain contact structure.

13. The semiconductor structure of claim 1, wherein both the buried power rail contact structure and the source/drain contact structure has an upper portion having a first width and a lower portion having a second width, wherein the first width is less than the second width.

14. A semiconductor structure comprising:
a first functional gate structure having a first source/drain region and located in a first active area of a semiconductor substrate;
a second functional gate structure having a second source/drain region and located in a second active area of the semiconductor substrate;
a shallow trench isolation structure separating the first active area of the semiconductor substrate from the second active area of the semiconductor substrate;
a buried power rail located between the first active area and the second active area and beneath a topmost surface of the shallow trench isolation structure;
a buried power rail contact structure contacting the buried power rail and the first source/drain region;
a source/drain contact structure contacting the second source/drain region, wherein both the buried power rail contact structure and the source/drain contact structure are pyramidal in shape and the buried power rail contact structure has a topmost surface that is vertically offset from, and located beneath, a topmost surface of the source/drain contact structure; and
an interlayer dielectric material layer located laterally adjacent to, and above, the buried power rail contact structure, and laterally adjacent to the source/drain contact structure, wherein the buried power rail contact structure is entirely embedded in the interlayer dielectric material layer, and the interlayer dielectric material layer has a topmost surface that is coplanar with a topmost surface of the source/drain contact structure.

15. The semiconductor structure of claim 14, wherein the buried power rail contact structure is a wrap-around contact contacting an upper portion of outermost sidewalls of the first source/drain region and a topmost surface of the first source/drain region.

16. The semiconductor structure of claim 14, wherein the source/drain contact structure is a wrap-around contact contacting an upper portion of outermost sidewalls of the second source/drain region and a topmost surface of the second source/drain region.

\* \* \* \* \*